United States Patent
Lee et al.

(10) Patent No.: US 11,705,478 B2
(45) Date of Patent: Jul. 18, 2023

(54) DISPLAY DEVICE

(71) Applicant: Samsung Display Co., LTD., Yongin-si (KR)

(72) Inventors: Jong Chan Lee, Yongin-si (KR); Jeong Nyun Kim, Yongin-si (KR); Jung Gun Nam, Yongin-si (KR); Sung Geun Bae, Yongin-si (KR); Sung Jin Lee, Yongin-si (KR); Tae Hee Lee, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 316 days.

(21) Appl. No.: 17/179,906

(22) Filed: Feb. 19, 2021

(65) Prior Publication Data

US 2021/0408104 A1   Dec. 30, 2021

(30) Foreign Application Priority Data

Jun. 30, 2020   (KR) .......................... 10-2020-0080592

(51) Int. Cl.
| | |
|---|---|
| *H01L 27/15* | (2006.01) |
| *H01L 25/075* | (2006.01) |
| *H01L 33/38* | (2010.01) |
| *H01L 33/58* | (2010.01) |

(52) U.S. Cl.
CPC ........ *H01L 27/156* (2013.01); *H01L 25/0753* (2013.01); *H01L 33/38* (2013.01); *H01L 33/58* (2013.01)

(58) Field of Classification Search
CPC . H01L 25/075; H01L 25/0753; H01L 25/167; H01L 27/15; H01L 27/156
See application file for complete search history.

(56) References Cited

U.S. PATENT DOCUMENTS

| | | | |
|---|---|---|---|
| 2016/0372514 A1* | 12/2016 | Chang | G09G 3/2003 |
| 2021/0217739 A1* | 7/2021 | Lee | H01L 33/50 |
| 2021/0280662 A1* | 9/2021 | Kim | H01L 25/0753 |

FOREIGN PATENT DOCUMENTS

| | | | | |
|---|---|---|---|---|
| CN | 113257851 A | * | 8/2021 | ......... H01L 25/0753 |
| KR | 10-2020-0027136 | | 3/2020 | |

* cited by examiner

*Primary Examiner* — Robert G Bachner
*Assistant Examiner* — Molly K Reida
(74) *Attorney, Agent, or Firm* — Kile Park Reed & Houtteman PLLC

(57) ABSTRACT

A display device includes a first pixel including a first light emitting area in which first light emitting elements are arranged, a second pixel including a second light emitting area in which second light emitting elements are arranged, a light blocking pattern disposed on the first and second pixels to overlap a peripheral area of the first and second light emitting areas and including a first opening corresponding to the first light emitting area and a second opening corresponding to the second light emitting area, and a color filter including a first color filter pattern disposed in the first opening and a second color filter pattern disposed in the second opening. The second pixel includes a greater number of second light emitting elements than a number of the first light emitting elements. The second opening has an area smaller than an area of the first opening.

14 Claims, 22 Drawing Sheets

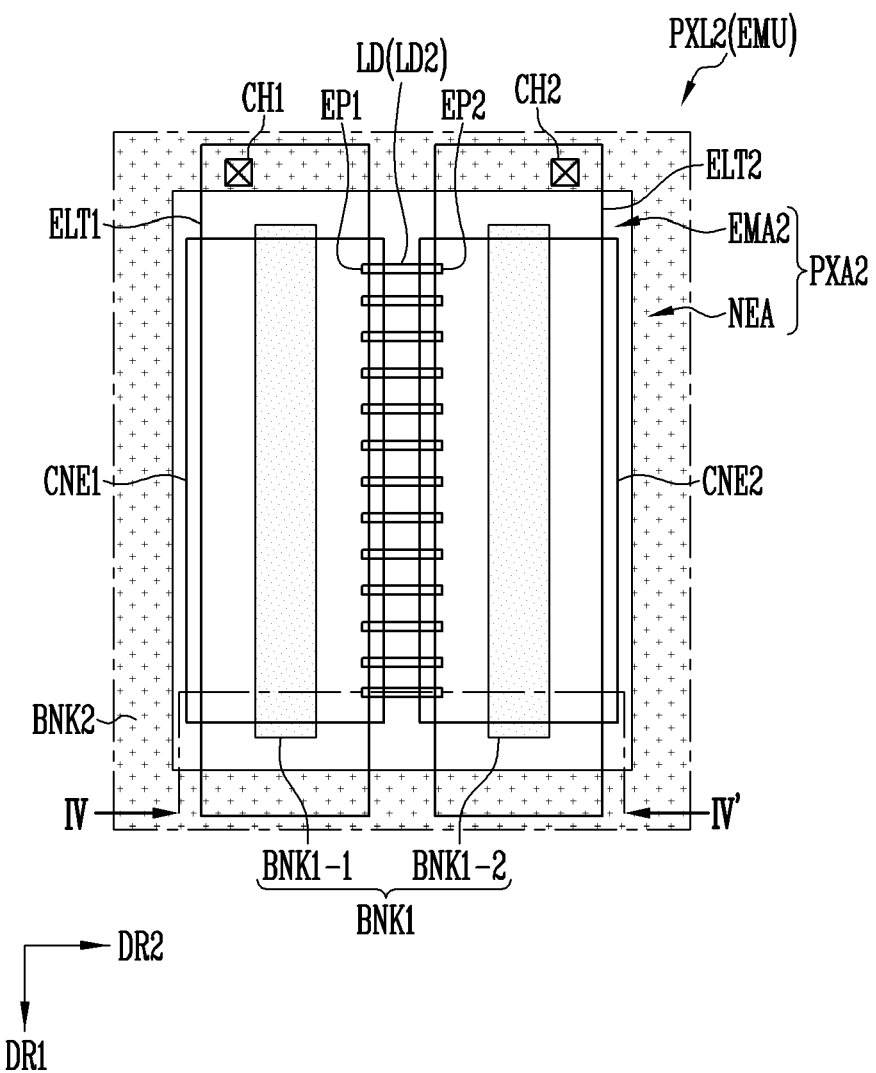

DISPLAY DEVICE

CROSS-REFERENCE TO RELATED APPLICATION(S)

This application claims priority to and benefits of Korean Patent Application No. 10-2020-0080592 under 35 U.S.C. § 119, filed on Jun. 30, 2020 in the Korean Intellectual Property Office, the entire contents of which are incorporated herein by reference.

BACKGROUND

1. Technical Field

An embodiment relates to a display device, and to a display device including a light emitting element.

2. Description of the Related Art

Recently, interest in information display is increasing. Accordingly, research and development of a display device has been continuously conducted.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

An object of the disclosure is to provide a display device including a light emitting element.

A display device according to an embodiment may include at least one first pixel each including a first light emitting area in which first light emitting elements may be arranged; at least one second pixel each including a second light emitting area in which second light emitting elements may be arranged; a light blocking pattern disposed on the at least one first pixel and the at least one second pixel to overlap a peripheral area of the first light emitting area and the second light emitting area, the light blocking pattern including a first opening corresponding to the first light emitting area of the at least one first pixel and a second opening corresponding to the second light emitting area of the at least one second pixel; and a color filter including a first color filter pattern disposed in the first opening of the light blocking pattern; and a second color filter pattern disposed in the second opening of the light blocking pattern. The at least one second pixel may include a greater number of the second light emitting elements than a number of the first light emitting elements of the at least one first pixel. The second opening of the light blocking pattern may have an area smaller than an area of the first opening of the light blocking pattern.

In an embodiment, each of the first opening and the second opening of the light blocking pattern may have a shape extending along a first direction, and the second opening of the light blocking pattern may have a length shorter than a length of the first opening of the light blocking pattern in the first direction.

In an embodiment, the first color filter pattern and the second color filter pattern may have a same color and may have a shape extending along the first direction, and the second color filter pattern may have a length shorter than a length of the first color filter pattern in the first direction.

In an embodiment, the second color filter pattern may have an area smaller than an area of the first color filter pattern.

In an embodiment, the first light emitting elements and the second light emitting elements may emit light of a same color.

In an embodiment, the display device may further include a first color conversion pattern layer disposed on the at least one first pixel and the at least one second pixel and including first color conversion particles that may convert light emitted from the first light emitting elements and the second light emitting elements into light of a first color.

In an embodiment, the display device may include the at least one first pixel may include a plurality of first pixels including first light emitting elements arranged in each first light emitting area of the plurality of first pixels, and the at least one second pixel may include a plurality of second pixels including second light emitting elements arranged in each second light emitting area of the plurality of second pixels.

In an embodiment, the plurality of first pixels may include at least one first color first pixel, at least one second color first pixel, and at least one third color first pixel, and the plurality of second pixels may include at least one first color second pixel, at least one second color second pixel, and at least one third color second pixel.

In an embodiment, the first color second pixel may include second light emitting elements of a greater number than a number of first light emitting elements arranged in the first color first pixel, and the light blocking pattern may include an opening of a smaller area on the first color second pixel than an opening of an area on the first color first pixel.

In an embodiment, the display device may include at least one pixel block including a plurality of pixels arranged along a second direction, and the at least one pixel block may include first pixels disposed at ends of the at least one pixel block; and second pixels disposed between the first pixels disposed at the ends of the at least one pixel block in the second direction.

In an embodiment, the at least one pixel block may include a plurality of pixel blocks, and the display device may include a display area in which the plurality of pixel blocks may be arranged.

In an embodiment, the light blocking pattern may include first openings disposed on each of the first pixels; and second openings disposed on each of the second pixels and having an area smaller than an area of each of the first openings of the light blocking pattern.

In an embodiment, the color filter may include a first color first color filter pattern disposed on a first color first pixel among the first pixels; and a first color second color filter pattern disposed on a first color second pixel among the second pixels.

In an embodiment, the first color second color filter pattern may have an area smaller than an area of the first color first color filter pattern.

According to an embodiment, a luminance deviation of pixels may be reduced or prevented by adjusting an aperture ratio of the pixels according to a number deviation of light emitting elements. Accordingly, image quality of the display device may be improved.

BRIEF DESCRIPTION OF THE DRAWINGS

The above and other features of the disclosure will become more apparent by describing in further detail embodiments thereof with reference to the accompanying drawings, in which:

FIG. 9B is a plan view illustrating a second pixel of FIG. 8;

DETAILED DESCRIPTION OF THE EMBODIMENTS

Figure 1A:
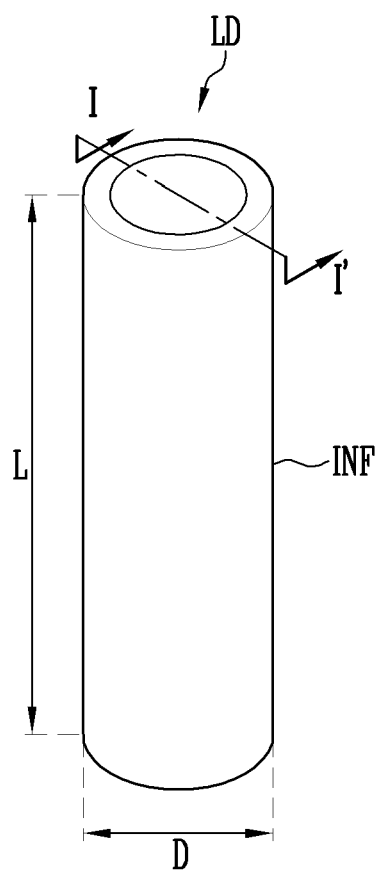
FIGS. 1A and 1B are a perspective view and a schematic cross-sectional view illustrating a light emitting element according to an embodiment.

The disclosure may be modified in various ways and may have various forms, and embodiments will be illustrated in the drawings and described in detail herein. In the following description, the singular forms also include the plural forms unless the context clearly includes the singular.

The disclosure is not limited to the embodiments disclosed below, and may be modified and implemented in various forms. For example, each of the embodiments disclosed below may be implemented alone or in combination with at least one of other embodiments.

In the drawings, some components which may not be directly related to a characteristic of the disclosure may be omitted for clarity and convenience. For example, some components in the drawings may be shown to be exaggerated in size or proportion for ease of description and for clarity. Throughout the drawings, the same or similar components will be given by the same reference numerals and symbols as much as possible even though they may be shown in different drawings, and repetitive descriptions may be omitted.

The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B."

It will be understood that, although the terms first, second, etc. may be used herein to describe various elements, these elements should not be limited by these terms. These terms are only used to distinguish one element from another element. Thus, a first element discussed below could be termed a second element without departing from the teachings of the disclosure.

As used herein, the singular forms, "a", "an" and "the" are intended to include the plural forms as well, unless the context clearly indicates otherwise.

It will be further understood that the terms "comprises" and/or "comprising", "includes" and/or "including", "has or have" and/or "having" and their variations when used in this specification, specify the presence of stated features, integers, steps, operations, elements, and/or components, but do not preclude the presence or addition of one or more other features, integers, steps, operations, elements, components, and/or groups thereof.

In the disclosure, it will be understood that when an element or layer is referred to as being "on", "connected to" or "coupled to" another element or layer, it may be directly on, connected or coupled to the other element or layer or intervening elements or layers may be present.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

Additionally, the terms "overlap" or "overlapped" mean that a first object may be above or below or to a side of a second object, and vice versa. Additionally, the term "overlap" may include layer, stack, face or facing, extending over, covering or partly covering or any other suitable term as would be appreciated and understood by those of ordinary skill in the art. The terms "face" and "facing" mean that a first element may directly or indirectly oppose a second element. In a case in which a third element intervenes between the first and second element, the first and second element may be understood as being indirectly opposed to one another, although still facing each other. When an element is described as 'not overlapping' or 'to not overlap' another element, this may include that the elements are spaced apart from each other, offset from each other, or set aside from each other or any other suitable term as would be appreciated and understood by those of ordinary skill in the art.

The phrase "in a plan view" means viewing the object from the top, and the phrase "in a schematic cross-sectional view" means viewing a cross-section of which the object is vertically cut from the side.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

As used herein, the term "unit" and/or "module" denotes a structure or element as illustrated in the drawings and as described in the specification. However, the disclosure is not limited thereto. The term "unit" and/or "module" is not to be limited to that which is illustrated in the drawings.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1B:
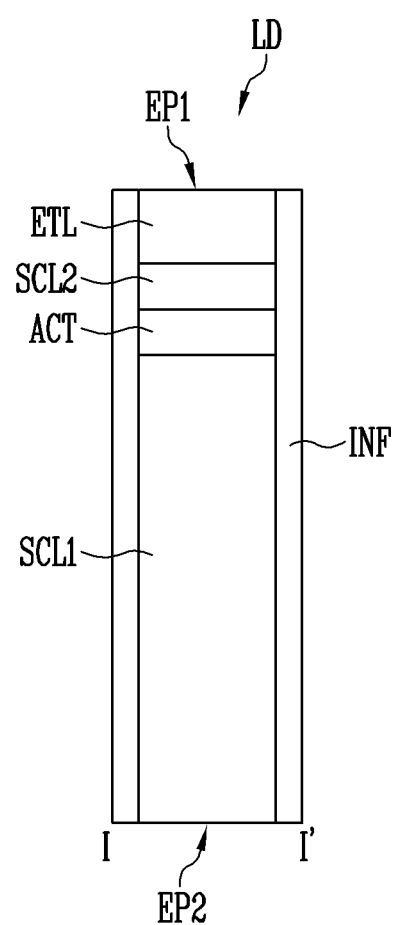

FIGS. 1A and 1B are a perspective view and schematic cross-sectional views illustrating a light emitting element LD according to an embodiment. For example, FIG. 1A illustrates an example of the light emitting element LD that may be used as a light source of a pixel according to an embodiment, and FIG. 1B illustrates an example of a cross-section of the light emitting element LD along a line I~I' of FIG. 1A.

Referring to FIGS. 1A and 1B, the light emitting element LD may include a first semiconductor layer SCL1, an active layer ACT, and a second semiconductor layer SCL2, which may be sequentially disposed along one or a direction, and an insulating film INF surrounding an outer circumferential surface (for example, a side surface) of the first semiconductor layer SCL1, the active layer ACT, and the second semiconductor layer SCL2. For example, the light emitting element LD may selectively further include an electrode layer ETL disposed on the second semiconductor layer SCL2. In this case, the insulating film INF may or may not at least partially surround the outer circumferential surface of the electrode layer ETL.

In an embodiment, the light emitting element LD may be provided in a stick (or rod) shape extending along one or a direction, and may have a first end portion EP1 and a second end portion EP2 at both end portions of a length L direction (or a thickness direction). The first end portion EP1 may be a first bottom surface (or an upper surface) of the light emitting element LD, and the second end portion EP2 may be a second bottom surface (or a lower surface) of the light emitting element LD.

In describing an embodiment, the term "rod-shaped" may encompass a rod-like shape or a bar-like shape that may be long (for example, having an aspect ratio greater than about 1) in the length L direction, such as a substantially circular column or a substantially polygonal column, and a shape of a cross section thereof is not particularly limited. For example, a length L of the light emitting element LD may be greater than a diameter D (or a width of the cross section) thereof.

The first semiconductor layer SCL1, the active layer ACT, the second semiconductor layer SCL2, and the electrode layer ETL may be sequentially disposed in a direction from the second end portion EP2 to the first end portion EP1 of the light emitting element LD. For example, the first semiconductor layer SCL1 may be disposed on the second end portion EP2 of the light emitting element LD, and the electrode layer ETL may be disposed on the first end portion EP1 of the light emitting element LD.

The first semiconductor layer SCL1 may be a semiconductor layer of a first conductivity type. For example, the first semiconductor layer SCL1 may be an N-type semiconductor layer including an N-type dopant. For example, the first semiconductor layer SCL1 may include any one semiconductor material among InAlGaN, GaN, AlGaN, InGaN, AlN, and InN, and may be an N-type semiconductor layer doped with a dopant such as Si, Ge, or Sn. However, the material forming the first semiconductor layer SCL1 is not limited thereto, and various materials in addition to the above-described materials may form the first semiconductor layer SCL1.

The active layer ACT may be disposed on the first semiconductor layer SCL1 and may be formed in a single-quantum well or multi-quantum well structure. A position of the active layer ACT may be variously changed according to the type of the light emitting element LD. The active layer ACT may emit light having a wavelength in a range of about 400 nm to about 900 nm, and may use a double heterostructure.

A clad layer (not shown) doped with a conductive dopant may be selectively formed on and/or under or below the active layer ACT. For example, the clad layer may be formed of an AlGaN layer or an InAlGaN layer. According to an embodiment, a material such as AlGaN or AlInGaN may be used to form the active layer ACT, and various materials in addition to the above-described materials may form the active layer ACT.

In a case that a voltage equal to or greater than a threshold voltage may be applied to the both end portions of the light emitting element LD, the light emitting element LD may emit light while electron-hole pairs may be combined in the active layer ACT. By controlling light emission of the light emitting element LD using such a principle, the light emitting element LD may be used as a light source of various light emitting devices including a pixel of a display device.

The second semiconductor layer SCL2 may be disposed on the active layer ACT and may be a semiconductor layer of a second conductive type different from that of the first semiconductor layer SCL1. For example, the second semiconductor layer SCL2 may include a P-type semiconductor layer including a P-type dopant. For example, the second semiconductor layer SCL2 may include at least one semiconductor material among InAlGaN, GaN, AlGaN, InGaN, AlN, and InN, and may be a P-type semiconductor layer doped with a dopant such as Mg. However, the material forming the second semiconductor layer SCL2 is not limited thereto, and various materials in addition to the above-described materials may form the second semiconductor layer SCL2.

In an embodiment, the first semiconductor layer SCL1 and the second semiconductor layer SCL2 may have different lengths (or thicknesses) in the length L direction of the light emitting element LD. For example, the first semiconductor layer SCL1 may have a length (or a thickness) longer (or thicker) than that of the second semiconductor layer SCL2 along the length L direction of the light emitting element LD. Accordingly, the active layer ACT of the light emitting element LD may be positioned closer to the first end portion EP1 than the second end portion EP2.

The electrode layer ETL may be disposed on the second semiconductor layer SCL2. The electrode layer ETL may protect the second semiconductor layer SCL2, and may be a contact electrode for smoothly electrically connecting the second semiconductor layer SCL2 to a predetermined electrode, line, or the like within the spirit and the scope of the disclosure.

For example, the electrode layer ETL may be an ohmic contact electrode or a Schottky contact electrode.

The electrode layer ETL may be substantially transparent or translucent. Accordingly, light generated by the light emitting element LD may be transmitted to the outside of the light emitting element LD through the electrode layer ETL. In an embodiment, in a case that the light generated by the light emitting element LD does not pass through the electrode layer ETL and emitted to the outside of the light emitting element LD through an area except for one end portion of the light emitting element LD in which the electrode layer ETL is disposed, the electrode layer ETL may be formed to be opaque.

In an embodiment, the electrode layer ETL may include metal or metal oxide. For example, the electrode layer ETL may be formed using chromium (Cr), titanium (Ti), aluminum (Al), gold (Au), nickel (Ni), ITO, IZO, ITZO, oxide or alloy thereof, and the like alone or in combination.

The insulating film INF may expose the electrode layer ETL and the first semiconductor layer SCL1 at the first and second end portions EP1 and EP2 of the light emitting element LD, respectively.

In a case that the insulating film INF is provided to cover or overlap a surface of the light emitting element LD, for example, the outer circumferential surface of the first semiconductor layer SCL1, the active layer ACT, the second semiconductor layer SCL2, and/or the electrode layer ETL, a short defect through the light emitting element LD may be prevented. Accordingly, electrical stability of the light emitting element LD may be secured.

In a case that the insulating film INF is provided on the surface of the light emitting element LD, a surface defect of the light emitting element LD may be minimized, and thus life and efficiency may be improved. For example, in a case that the insulating film INF may be formed or disposed on each light emitting element LD, even though a plurality of light emitting elements LD may be disposed close to each other, occurrence of an unwanted short circuit between the light emitting elements LD may be prevented.

In an embodiment, the light emitting element LD may be manufactured through a surface treatment process. For example, the surface treatment may be performed on each light emitting element LD so that in a case that a plurality of light emitting elements LD may be mixed in a fluid solution (or solvent) and supplied to each light emitting area (for example, a light emitting area of each pixel), the light emitting elements LD may be uniformly dispersed in the solution without being un-uniformly aggregated. As a non-limiting embodiment related to this, the insulating film INF itself may be formed as a hydrophobic film using a hydrophobic material, or a hydrophobic film formed of a hydrophobic material may be additionally formed or disposed on the insulating film INF.

The insulating film INF may include a transparent insulating material. Accordingly, light generated in the active layer ACT may pass through the insulating film INF and be emitted to the outside of the light emitting element LD. For example, the insulating film INF may include at least one insulating material of $SiO_2$ or silicon oxide (SiOx) but is not confined thereto, $Si_3N_4$ or silicon nitride (SiNx) but is not confined thereto, $Al_2O_3$ or aluminum oxide ($Al_xO_y$) but is not confined thereto, and $TiO_2$ or titanium oxide ($Ti_xO_y$) but is not confined thereto, but is not limited thereto.

In an embodiment, the light emitting element LD may have a size as small as nano scale to micro scale. For example, each light emitting element LD may have the diameter D (or width) and/or the length L of a nano scale to micro scale range. However, a size of the light emitting element LD is not limited thereto in the disclosure. For example, the size of the light emitting element LD may be variously changed according to a design condition of various light emitting devices using the light emitting element LD as a light source.

A light emitting device including the light emitting element LD may be used in various types of devices that require a light source, including a display device. For example, a plurality of light emitting elements LD may be arranged or disposed in each pixel of a display panel, and the light emitting elements LD may be used as a light source of each pixel. However, an application field of the light emitting element LD is not limited to the above-described example, and the light emitting element LD may be used in other types of devices such as a lighting device.

Figure 2:
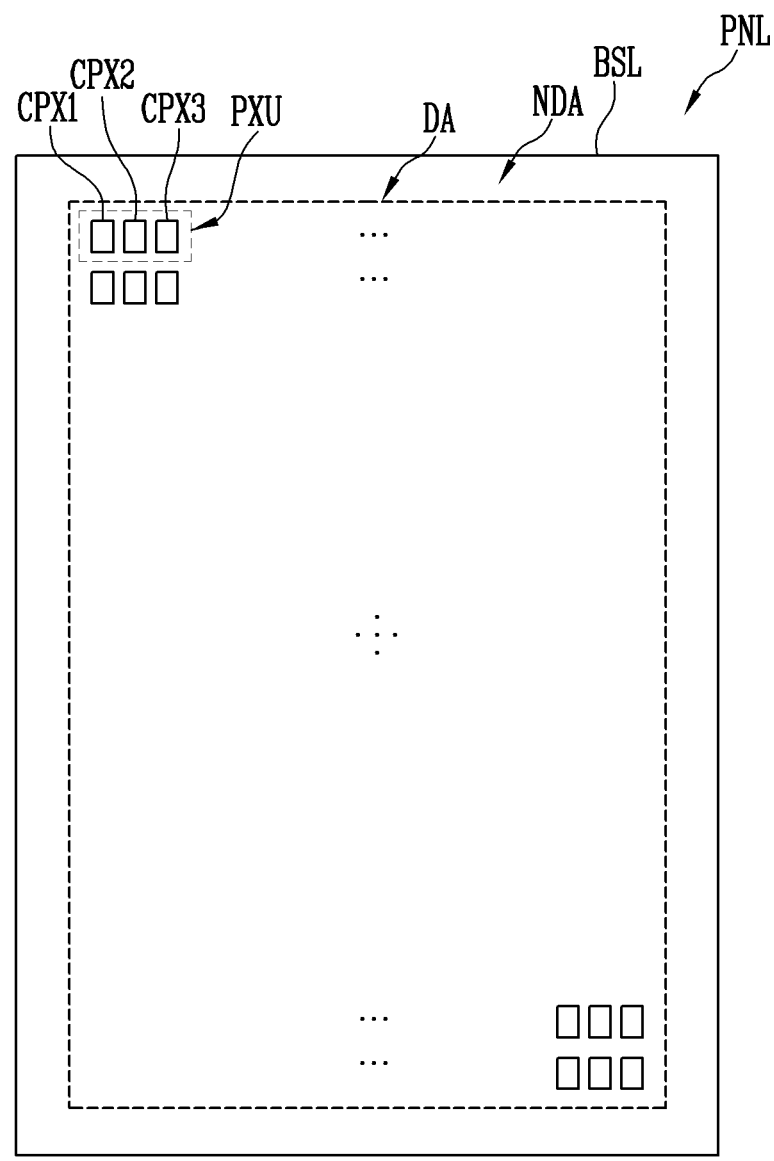
FIG. 2 is a plan view illustrating a display device according to an embodiment.

FIG. 2 is a plan view illustrating a display device according to an embodiment. FIG. 2 shows a display device, for example, a display panel PNL included in the display device, as an example of an electronic device that may use the light emitting element LD described in an embodiment of FIGS. 1A and 1B as a light source. For example, each pixel unit PXU of the display panel PNL and each pixel forming the pixel unit PXL may include at least one light emitting element LD.

For convenience, in FIG. 2, a structure of the display panel PNL may be shown centering on a display area DA. However, according to an embodiment, at least one driving circuit unit, lines and/or pads, which are not shown, may be further disposed on the display panel PNL.

Referring to FIG. 2, the display panel PNL according to an embodiment may include a base layer BSL and pixels disposed on the base layer BSL. The pixels may include first color pixels CPX1, second color pixels CPX2, and/or third color pixels CPX3. Hereinafter, in a case that one or more pixels of the first color pixels CPX1, the second color pixels CPX2, and the third color pixels CPX3 may be arbitrarily referred to, or in a case that two or more types of pixels may be collectively referred to, the one or more pixels or two or more types of pixels may be referred to as a "pixel PXL" or "pixels PXL".

By way of example, the display panel PNL and the base layer BSL for forming the display panel PNL may include the display area DA for displaying an image, and a non-display area NDA excluding the display area DA. For example, the pixels PXL may be disposed in the display area DA on the base layer BSL.

The display area DA may be disposed in a center area of the display panel PNL, and the non-display area NDA may be disposed in an edge area of the display panel PNL to surround or to be adjacent to the display area DA. However, positions of the display area DA and the non-display area NDA may be changed.

The base layer BSL may form a base member of the display panel PNL, and may be a rigid or flexible substrate or film. For example, the base layer BSL may be a rigid substrate formed of glass or tempered glass, a flexible substrate (or a thin film) of a material of plastic or metal, or at least one insulating film. The material and/or physical properties of the base layer BSL are/is not particularly limited.

One area on the base layer BSL may be defined as the display area DA and the pixels PXL may be disposed, and the remaining areas may be defined as the non-display area NDA. For example, the base layer BSL may include the display area DA including a plurality of pixel areas in which each pixel PXL may be formed or disposed, and the non-display area NDA disposed outside the display area DA. Various lines, pads, and/or built-in circuit units electrically connected to the pixels PXL of the display area DA may be disposed in the non-display area NDA.

The pixels PXL may be arranged or disposed in the display area DA. For example, the pixels PXL may be regularly arranged or disposed in the display area DA along a first direction DR1 and a second direction DR2 according to a stripe or pen-tile arrangement structure, and the like within the spirit and the scope of the disclosure. However, an arrangement structure of the pixels PXL is not limited thereto, and the pixels PXL may be arranged or disposed in the display area DA in various structures and/or methods.

According to an embodiment, two or more types of pixels PXL emitting light of different colors may be disposed in the display area DA. For example, in the display area DA, the first color pixels CPX1 (or first sub pixels) that emit light of a first color, the second color pixels CPX2 (or second sub pixels) that emit light of a second color, and third color pixels CPX3 (or third sub pixels) that emit light of a third color may be arranged or disposed. For example, the first color pixel CPX1, the second color pixel CPX2, and the third color pixel CPX3 disposed to be adjacent to each other may form one pixel unit PXU capable of emitting light of various colors.

According to an embodiment, the first color pixel CPX1 may be a red pixel that emits red light, the second color pixel CPX2 may be a green pixel that emits green light, and the third color pixel CPX3 may be a blue pixel that emits blue light. In an embodiment, the first color pixel CPX1, the second color pixel CPX2, and the third color pixel CPX3 may include a first color light emitting element, a second color light emitting element, and a third color light emitting element as a light source, to emit light of the first color, the second color, and the third color, respectively. In an embodiment, the first color pixel CPX1, the second color pixel CPX2, and the third color pixel CPX3 may include light emitting elements of the same color, and may emit light of the first color, the second color, and the third color, respectively, by including a color conversion layer and/or a color filter of different colors disposed on the respective light emitting elements, respectively.

However, the color, type, number, and/or the like of the pixels PXL forming each pixel unit PXU are/is not particularly limited. For example, the color of light emitted by each pixel PXL may be variously changed.

The pixel PXL may include at least one light source driven by a predetermined control signal (for example, a scan signal and a data signal) and/or predetermined power (for example, first power and second power). In an embodiment, the light source may include at least one light emitting element LD according to an embodiment of FIGS. 1A and 1B, for example, at least one rod-shaped light emitting element LD having a size as small as nano scale to micro scale, but the disclosure is not limited thereto. For example, in an embodiment, the light source of each pixel PXL may be formed using a light emitting element LD of a core-shell structure.

For example, the pixel PXL may have a structure according to at least one of embodiments described below. For example, each pixel PXL may have a structure according to any one of the embodiments disclosed in FIGS. 3 to 5B, or may have a structure in which at least two embodiments of the above-described embodiments may be combined.

In an embodiment, the pixel PXL may be formed as an active pixel, but is not limited thereto. For example, the pixel PXL may be formed as a pixel of a passive or active light emitting display device of various structures and/or driving methods.

Figure 3:
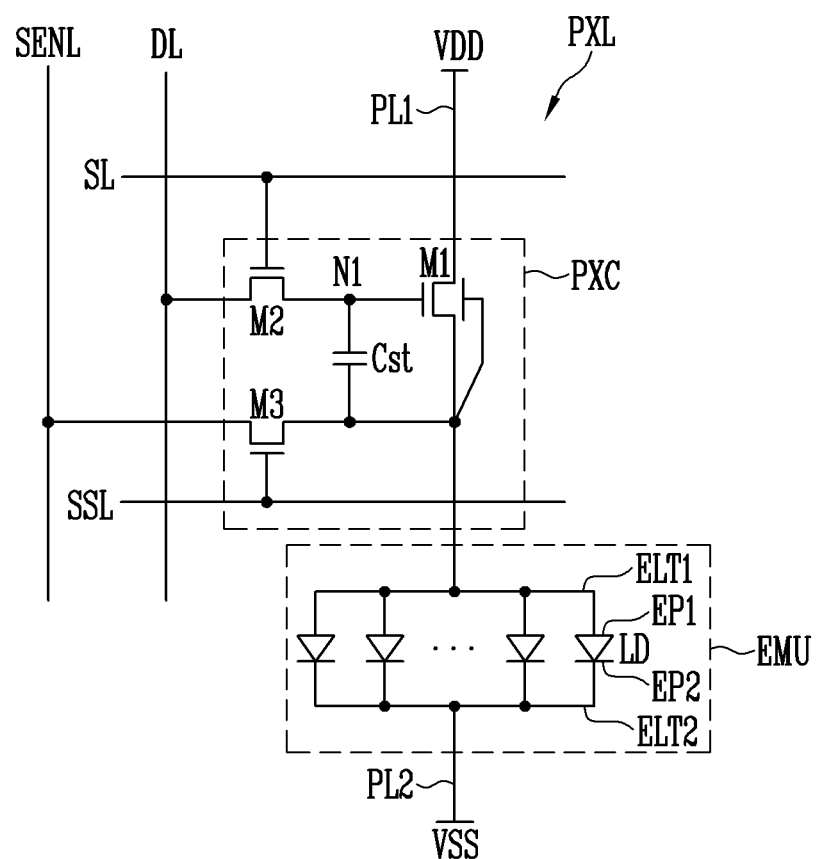
FIG. 3 is an equivalent circuit diagram illustrating a pixel of the display device according to an embodiment.

FIG. 3 is an equivalent circuit diagram illustrating the pixel PXL of the display device according to an embodiment. For example, FIG. 3 illustrates an embodiment of the pixel PXL that may be applied to an active display device. However, types of the pixel PXL and the display device to which an embodiment may be applied are not limited thereto.

According to an embodiment, each pixel PXL shown in FIG. 3 may be any one of the first color pixel CPX1, the second color pixel CPX2, and the third color pixel CPX3 included in the display panel PNL of FIG. 2. For example, the first color pixel CPX1, the second color pixel CPX2, and the third color pixel CPX3 may have structures substantially the same as or similar to each other.

Referring to FIG. 3, the pixel PXL may include a light emitting unit EMU for generating light of a luminance corresponding to a data signal. For example, the pixel PXL may further include a pixel circuit PXC for driving the light emitting unit EMU.

The light emitting unit EMU may include at least one light emitting element LD, for example, a plurality of light emitting elements LD, electrically connected between first power VDD and second power VSS. In describing each embodiment, a term "connection (or access)" may comprehensively mean a physical and/or electrical connection (or access). For example, this may comprehensively mean a direct or indirect connection (or access) and an integral or non-integral connection (or access).

For example, the light emitting unit EMU may include a first electrode ELT1 (also referred to as a "first pixel electrode" or a "first alignment electrode") electrically connected to the first power VDD via the pixel circuit PXC and a first power line PL1, a second electrode ELT2 (also referred to as a "second pixel electrode" or a "second alignment electrode") electrically connected to the second power VSS via a second power line PL2, and the plurality of light emitting elements LD electrically connected in parallel in the same direction between the first and second electrodes ELT1 and ELT2. In an embodiment, the first electrode ELT1 may be an anode electrode, and the second electrode ELT2 may be a cathode electrode.

Each of the light emitting elements LD may include the first end portion EP1 (for example, a P-type end portion) electrically connected to the first power VDD through the first electrode ELT1 and/or the pixel circuit PXC, and the second end portion EP2 (for example, an N-type end portion) electrically connected to the second power VSS through the second electrode ELT2. For example, the light emitting elements LD may be electrically connected in parallel in a forward direction between the first and second electrodes ELT1 and ELT2. Each light emitting element LD electrically connected in the forward direction between the first power VDD and the second power VSS may form each effective light source, and the effective light sources may be gathered to form the light emitting unit EMU of the pixel PXL.

The first power VDD and the second power VSS may have different potentials so that the light emitting elements LD emit light. For example, the first power VDD may be set as a high potential power, and the second power VSS may be set as a low potential power.

The first end portion EP1 of the light emitting elements LD forming each light emitting unit EMU may be commonly electrically connected to the pixel circuit PXC through one electrode (for example, the first electrode ELT1 of each pixel PXL) of the light emitting unit EMU, and may be electrically connected to the first power VDD through the pixel circuit PXC and the first power line PL1. For example, the second end portion EP2 of the light emitting elements LD may be commonly electrically connected to the second power VSS through another electrode (for example, the second electrode ELT2 of each pixel PXL) of the light emitting unit EMU and the second power line PL2.

The light emitting elements LD may emit light at a luminance corresponding to a driving current supplied through a corresponding pixel circuit PXC. For example, during each frame period, the pixel circuit PXC may supply a driving current corresponding to a grayscale value to be expressed in a corresponding frame to the light emitting unit EMU. The driving current supplied to the light emitting unit EMU may be divided and flow to the light emitting elements LD electrically connected in the forward direction. Accordingly, while each light emitting element LD emits light at a luminance corresponding to the current flowing therein, the light emitting unit EMU may emit light of a luminance corresponding to the driving current.

In an embodiment, the light source unit LSU may further include at least one ineffective light source in addition to the light emitting elements LD forming each effective light source. For example, at least one ineffective light emitting element which may be arranged or disposed in a reverse direction or of which at least one or an end portion may be floated may be further electrically connected to at least one series stage. The ineffective light emitting element maintains a deactivated state even though a driving voltage (for example, a driving voltage of a forward direction) may be applied between the first and second electrodes ELT and ELT2, and thus a non-light emitting state may be substantially maintained.

Meanwhile, although FIG. 3 discloses an embodiment in which the pixel PXL may include the light emitting unit EMU of a parallel structure, the disclosure is not limited thereto. For example, the pixel PXL may include a light emitting unit EMU of a series structure or a series/parallel structure. In this case, the light emitting unit EMU may include the light emitting elements LD electrically connected in the series structure or the series/parallel structure between the first electrode ELT1 and the second electrode ELT2.

The pixel circuit PXC may be electrically connected between the first power VDD and the first electrode ELT1. The pixel circuit PXC may be electrically connected to a scan line SL and a data line DL of the corresponding pixel PXL. For example, the pixel circuit PXC may be selectively electrically connected to a sensing signal line SSL and a sensing line SENL.

The pixel circuit PXC may include a first transistor M1, a second transistor M2, a third transistor M3, and a storage capacitor Cst.

The first transistor M1 may be electrically connected between the first power VDD and the first electrode ELT1 of the light emitting unit EMU. For example, a gate electrode of the first transistor M1 may be electrically connected to a first node N1. The first transistor M1 controls the driving current supplied to the light emitting unit in correspondence with a voltage of the first node N1. For example, the first transistor M1 may be a driving transistor that controls a driving current of the pixel PXL.

For example, the first transistor M1 may further include a back gate electrode electrically connected to the first electrode ELT1. The back gate electrode may be disposed to overlap the gate electrode with an insulating layer interposed therebetween.

The second transistor M2 may be electrically connected between the data line DL and the first node N1. For example, a gate electrode of the second transistor M2 may be electrically connected to the scan line SL. The second transistor M2 is turned on in a case that a scan signal of a gate-on voltage (for example, a high level voltage) is supplied from the scan line SL, to electrically connect the data line DL and the first node N1.

For each frame period, a data signal of a corresponding frame is supplied to the data line DL, and the data signal is transferred to the first node N1 through the turned on second transistor M2 during a period in which the scan signal of the gate-on voltage is supplied. For example, the second transistor M2 may be a switching transistor for transferring each data signal to the inside of the pixel PXL.

One electrode of the storage capacitor Cst may be electrically connected to the first node N1, and another electrode may be electrically connected to a second electrode of the transistor M1. The storage capacitor Cst charges a voltage corresponding to the data signal supplied to the first node N1 during each frame period.

The third transistor M3 may be electrically connected between the first electrode ELT1 of the light emitting unit EMU (or the second electrode of the first transistor M1) and the sensing line SENL. For example, a gate electrode of the third transistor M3 may be electrically connected to the sensing signal line SSL. The third transistor M3 may transfers a voltage value applied to the first electrode ELT1 of the light emitting unit EMU to the sensing line SENL according to a sensing signal supplied to the sensing signal line SSL during a predetermined sensing period. The voltage value transferred through the sensing line SENL may be provided to an external circuit (for example, a timing controller), and the external circuit may extract characteristic information (for example, a threshold voltage or the like of the first transistor M1) of each pixel PXL based on the provided voltage value. The extracted characteristic information may be used to convert image data so that a characteristic deviation between the pixels PXL is compensated.

Meanwhile, in FIG. 3, all transistors included in the pixel circuit PXC, for example, the first, second, and third transistors M1, M2, and M3 may be N-type transistors, but the disclosure is not limited thereto. For example, at least one of the first, second, and third transistors M1, M2, and M3 may be changed to a P-type transistor. In an embodiment, the pixel circuit PXC may include P-type and N-type transistors in combination.

For example, a structure and a driving method of the pixel PXL may be variously changed. For example, the pixel circuit PXC may be formed of a pixel circuit of various structures and/or driving methods, in addition to an embodiment shown in FIG. 3.

For example, the pixel circuit PXC may not include the third transistor M3. For example, the pixel circuit PXC may further include other circuit elements such as a compensation transistor for compensating for the threshold voltage of the first transistor M1, an initialization transistor for initializing the voltage of the first node N1 or the first electrode ELT1 of the light emitting unit EMU, a light emitting control transistor for controlling a period in which the driving current is supplied to the light emitting unit EMU, and/or a boosting capacitor for boosting the voltage of the first node N1.

In an embodiment, in a case that each pixel PXL may be formed in a passive light emitting display device or the like, the pixel circuit PXC may be omitted. For example, each of the first and second electrodes ELT1 and ELT2 of the light emitting unit EMU may be directly electrically connected to the scan line SL, the data line DL, the first power line PL1, the second power line PL2, other signal lines or power lines, or the like within the spirit and the scope of the disclosure.

Figure 4A:
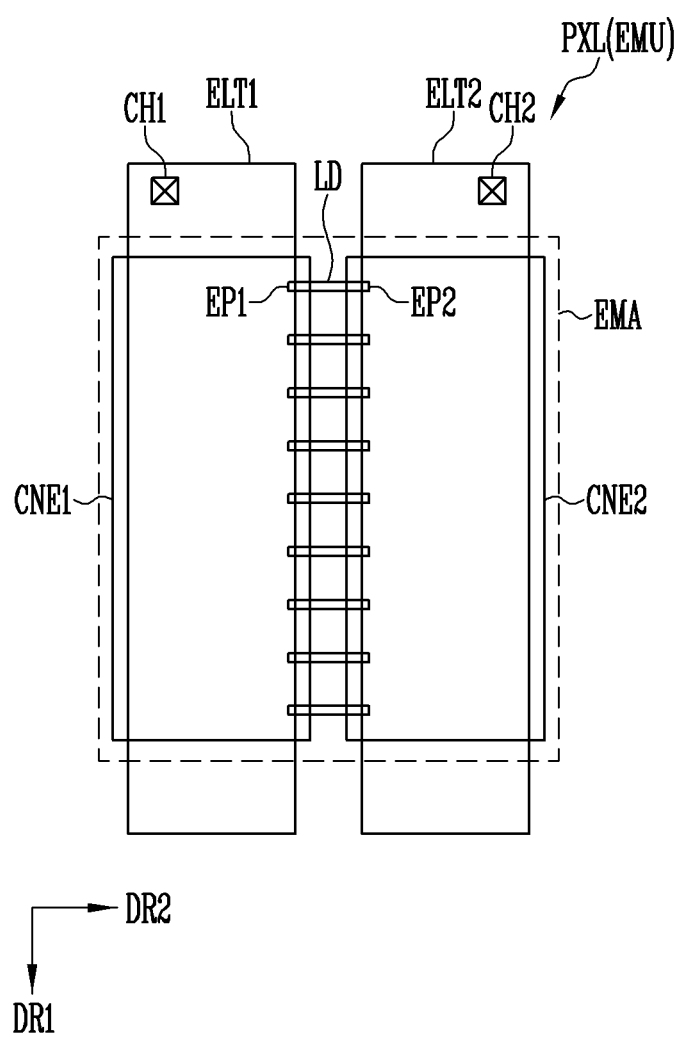
FIGS. 4A and 4B are plan views illustrating pixel of the display device according to an embodiment, respectively.
Figure 4B:
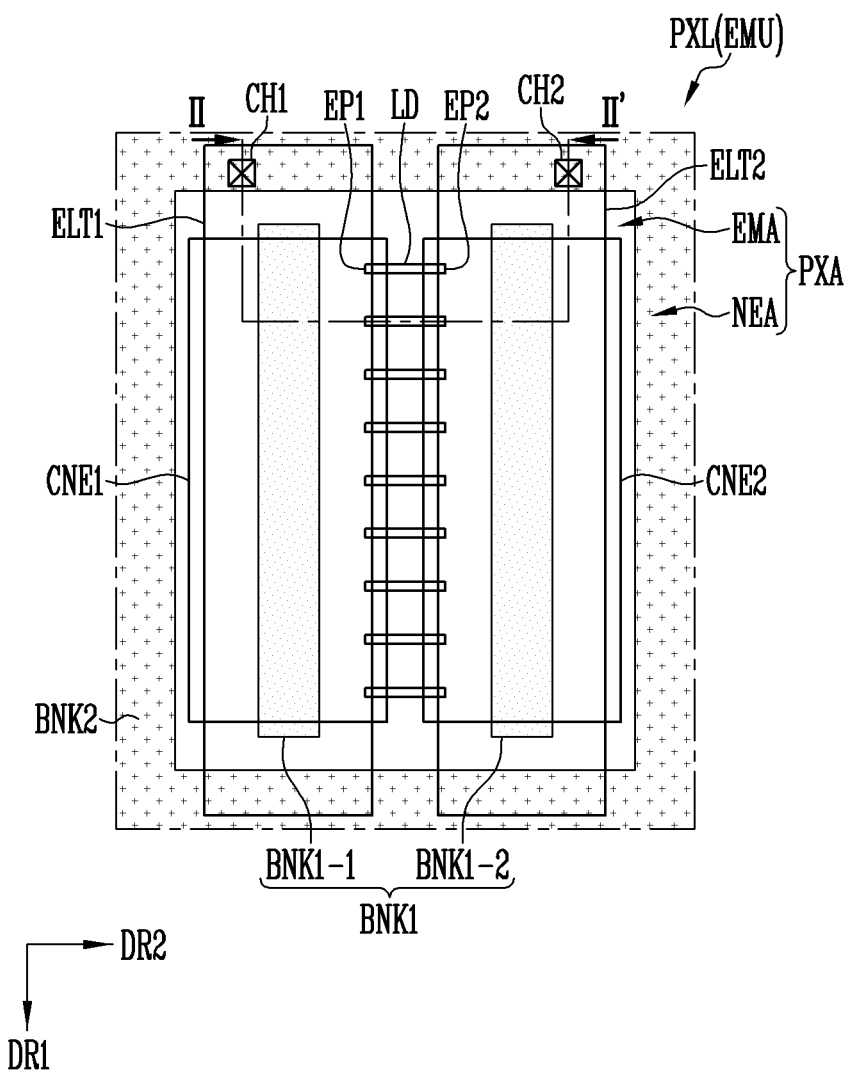

FIGS. 4A and 4B are plan views illustrating the pixel PXL of the display device according to an embodiment, respectively. In FIGS. 4A and 4B, a structure of the pixel PXL is shown centering on the light emitting unit EMU of the pixel PXL. For example, FIGS. 4A and 4B illustrate an example structure of the light emitting unit EMU including the first and second electrodes ELT1 and ELT2, and the plurality of light emitting elements LD electrically connected in parallel between the first and second electrodes ELT1 and ELT2, as in an embodiment of FIG. 3. However, the structure of the light emitting unit EMU, including a connection structure of the light emitting elements LD, may be variously changed.

For example, FIGS. 4A and 4B show an embodiment in which each light emitting unit EMU may be electrically connected to a predetermined power line (for example, the first and/or second power line PL1 and/or PL2) through first and second contact holes CH1 and CH2, a circuit element (for example, at least one circuit element forming the pixel circuit PXC) and/or the signal line (for example, the scan line SL and/or the data line DL). However, in an embodiment, at least one of the first and second electrodes ELT1 and ELT2 of each pixel PXL may be directly electrically connected to the predetermined power line and/or the signal line without passing through a contact hole, an intermediate line, and/or the like within the spirit and the scope of the disclosure.

First, referring to FIG. 4A, the pixel PXL may include the first electrode ELT1 and the second electrode ELT2 disposed in each light emitting area EMA, and at least one light emitting element LD (for example, a plurality of light emitting elements LD electrically connected in parallel between the first and second electrodes ELT1 and ELT2) disposed between the first electrode ELT1 and the second electrode ELT2. Here, the term "the light emitting element LD is disposed between the first and second electrodes ELT1 and ELT2" may mean that at least one region of the light emitting element LD is positioned between a region between the first and second electrodes ELT1 and ELT2 on the plan view.

For example, the pixel PXL may further include a first contact electrode CNE1 and a second contact electrode CNE2 that electrically connect the light emitting elements LD to the region between the first and second electrodes ELT1 and ELT2.

The first electrode ELT1 and the second electrode ELT2 may be disposed in each pixel area in which each pixel PXL may be provided or disposed and/or formed. For example, the first electrode ELT1 and the second electrode ELT2 may be disposed in the light emitting area EMA of each pixel PXL.

According to an embodiment, each pixel area may comprehensively mean a pixel circuit area in which circuit elements for forming a corresponding pixel PXL may be disposed and the light emitting area EMA in which the light emitting unit EMU of the pixel PXL is disposed. For example, the light emitting area EMA may be an area in which the light emitting elements LD (for example, the effective light sources electrically connected in the forward direction between the first and second electrodes ELT1 and ELT2) forming the light emitting unit EMU of each pixel PXL may be disposed. For example, in the light emitting area EMA, predetermined electrodes (for example, the first and second electrodes ELT1 and ELT2, and/or the first and second contact electrodes CNE1 and CNE2) electrically connected to the light emitting elements LD, or one region of the electrodes may be disposed.

The light emitting area EMA may be surrounded by a light-blocking and/or reflective bank structure (for example, a pixel defining film and/or a black matrix) formed or disposed between the pixels PXL to define each pixel area and the light emitting area EMA therein. For example, a bank structure (corresponding to a "second bank BNK2" of FIG. 4B) surrounding the light emitting area EMA may be disposed around the light emitting area EMA.

The first and second electrodes ELT1 and ELT2 may be disposed to be spaced apart from each other. For example, each of the first and second electrodes ELT1 and ELT2 may extend along the first direction DR1 in the light emitting area EMA, and the first and second electrodes ELT1 and ELT2 may be spaced apart along the second direction DR2 crossing or intersecting the first direction DR1 by a predetermined interval. In an embodiment, the first direction DR1 may be a vertical direction (or a column direction), and the second direction DR2 may be a horizontal direction (or a row direction), but the disclosure is not limited thereto.

According to an embodiment, the first and/or second electrodes ELT1 and ELT2 may have a pattern separated for each pixel PXL or a pattern commonly connected in a plurality of pixels PXL. For example, as shown in FIG. 4A, the first and second electrodes ELT1 and ELT2 may have an independent pattern of which both ends may be cut outside a corresponding light emitting area EMA or inside the light emitting area EMA. In an embodiment, the first electrode ELT1 may have an independent pattern for example cut outside a corresponding light emitting area EMA or inside the light emitting area EMA, and one end portion of the second electrode ELT2 may extend along the first direction DR1 or a second direction DR2 and thus the second electrode ELT2 may be integrally connected to the second electrode ELT2 of another pixel PXL adjacent in the first direction DR1 or the second direction DR2.

Meanwhile, before a process of forming the pixel PXL, for example, an alignment of the light emitting elements LD may be completed, the first electrodes ELT1 of the pixels PXL disposed in the display area DA may be electrically connected to each other, and the second electrodes ELT2 of the pixels PXL may be electrically connected to each other. For example, before the alignment of the light emitting elements LD is completed, the first electrodes ELT1 of the pixels PXL may be integrally or non-integrally formed and electrically connected to each other, and the second electrodes ELT2 of the pixels PXL may be integrally or non-integrally formed and electrically connected to each other. In a case that the first electrodes ELT1 or the second electrodes ELT2 of the pixels PXL may be non-integrally connected to each other, the first electrodes ELT1 or the second electrodes ELT2 may be electrically connected to each other at least one contact hole, a bridge pattern, and/or the like within the spirit and the scope of the disclosure.

The first and second electrodes ELT1 and ELT2 (or first and second alignment lines before separation into the respective first and second electrodes ELT1 and ELT2) may receive a first alignment signal (or a first alignment voltage) and a second alignment signal (or a second alignment voltage) in aligning the light emitting elements LD, respectively. For example, one of the first and second electrodes ELT1 and ELT2 may receive an alignment signal of an alternating current type, and the other of the first and second electrodes ELT1 and ELT2 may receive an alignment voltage (for example, a ground voltage) having a constant voltage level.

For example, a predetermined alignment signal may be applied to the first and second electrodes ELT1 and ELT2 in aligning the light emitting elements LD. Accordingly, an electric field may be formed between the first and second electrodes ELT1 and ELT2. The light emitting elements LD supplied to each pixel area (for example, the light emitting area EMA of each pixel PXL) may be self-aligned between the first and second electrodes ELT1 and ELT2 by the electric field. For example, the light emitting elements LD may be aligned between the first and second electrodes ELT1 and ELT2 so that the first end portion EP1 and the second end portion EP2 may be adjacent to the first electrode ELT1 and the second electrode ELT2, respectively. After the alignment of the light emitting elements LD is completed, the pixels PXL may be individually driven by disconnecting at least the first electrodes ELT1 between the pixels PXL.

The first and second electrodes ELT1 and ELT2 may have various shapes. For example, each of the first and second electrodes ELT1 and ELT2 may have a substantially bar shape extending in one or a direction. For example, each of the first and second electrodes ELT1 and ELT2 may have a substantially bar shape extending along the first direction DR1. In an embodiment, the first and second electrodes ELT1 and ELT2 may have a substantially bent or substantially curved shape in at least one region. For example, each of the first and second electrodes ELT1 and ELT2 may have a uniform width or different widths for each region.

For example, the shape and/or structure of the first and second electrodes ELT1 and ELT2 may be variously changed. For example, the first electrode ELT1 and/or the second electrode ELT2 may be formed as a substantially spiral or substantially circular electrode.

For example, FIG. 4A discloses an embodiment in which one first electrode ELT1 and one second electrode ELT2 may be disposed in each light emitting area EMA, but the number and/or a mutual disposition structure of the first and second electrodes ELT1 and ELT2 disposed in each pixel PXL may be variously changed.

In a case that a plurality of first electrodes ELT1 may be disposed in one pixel PXL, the first electrodes ELT1 may be integrally or non-integrally connected to each other. For example, the first electrodes ELT1 may be integrally connected or may be connected to each other by a bridge pattern positioned on a layer (for example, a circuit layer on which the pixel circuit PXC is disposed) different from that of the first electrodes ELT1. Similarly, in a case that a plurality of second electrodes ELT2 may be disposed in one pixel PXL, the second electrodes ELT2 may be integrally or non-integrally connected to each other.

For example, in the disclosure, the shape, number, arrangement direction, mutual disposition relationship, and/or the like of the first and second electrodes ELT1 and ELT2 disposed in each pixel PXL may be variously changed.

In an embodiment, the first electrode ELT1 may be electrically connected to a predetermined circuit element (for example, at least one transistor forming the pixel circuit PXC), a power line (for example, the first power line PL1), and/or the signal line (for example, the scan line SL, the data line DL, or a predetermined control line) through a first contact hole CH1. In an embodiment, the first electrode ELT1 may be directly electrically connected to a predetermined power line or signal line.

In an embodiment, the first electrode ELT1 may be electrically connected to a predetermined circuit element disposed under or below the first electrode ELT1 through the first contact hole CH1 and may be electrically connected to a first line through the circuit element. The first line may be the first power line PL1 for supplying the first power VDD, but is not limited thereto.

In an embodiment, the second electrode ELT2 may be electrically connected to a predetermined circuit element (for example, at least one transistor forming the pixel circuit PXC), a power line (for example, the second power line PL2), and/or a signal line (for example, the scan line SL, the data line DL, or a predetermined control line) through the second contact hole CH2. In an embodiment, the second electrode ELT2 may be directly electrically connected to a predetermined power line or signal line.

In an embodiment, the second electrode ELT2 may be electrically connected to a second line disposed under or below the second electrode ELT2 through a second contact hole CH2. The second line may be the second power line PL2 for supplying the second power VSS, but is not limited thereto.

Each of the first and second electrodes ELT1 and ELT2 may be formed of a single layer or multiple layers. For example, the first electrode ELT1 may include a reflective electrode layer of at least one layer including a reflective conductive material, and may selectively further include a transparent electrode layer and/or a conductive capping layer of at least one layer. Similarly, the second electrode ELT2 may include a reflective electrode layer of at least one layer including a reflective conductive material, and may selectively further include a transparent electrode layer and/or a conductive capping layer of at least one layer. The reflective conductive material may be at least one of various metal materials including a metal having high reflectance in a visible light wavelength band, for example, aluminum (Al), gold (Au), and silver (Ag), but is not limited thereto.

The light emitting elements LD may be disposed between the first electrode ELT1 and the second electrode ELT2. For example, the light emitting elements LD may be arranged or disposed and electrically connected in parallel between the first electrode ELT1 and the second electrode ELT2. For example, each light emitting element LD may be aligned in the second direction DR2 between the first electrode ELT1 and the second electrode ELT2, and may be electrically connected between the first and second electrodes ELT1 and ELT2.

Meanwhile, FIG. 4A shows that all light emitting elements LD may be uniformly aligned in the second direction DR2, but the disclosure is not limited thereto. For example, at least one of the light emitting elements LD may be aligned in a diagonal direction or the like inclined with respect to the first and second directions DR1 and DR2 between the first and second electrodes ELT1 and ELT2.

According to an embodiment, each light emitting element LD may be a micro light emitting element of a small size as small as, for example, a nano scale to a micro scale, using a material of an inorganic crystal structure, but is not limited thereto. For example, each light emitting element LD may be the rod-shaped light emitting element LD as shown in FIGS. 1A and 1B, but is not limited thereto.

Each light emitting element LD may include the first end portion EP1 disposed toward the first electrode ELT1, and the second end portion EP2 disposed toward the second electrode ELT2. In an embodiment, each light emitting element LD may overlap the first electrode ELT1 and/or the second electrode ELT2, or may not overlap the first electrode ELT1 and/or the second electrode ELT2.

The first end portion EP1 of each of the light emitting elements LD may be electrically connected to the first electrode ELT1, and the second end portion EP2 of each of the light emitting elements LD may be electrically connected to the second electrode ELT2. For example, the first end portion EP1 of each of the light emitting elements LD may be electrically connected to the first electrode ELT1 through the first contact electrode CNE1, and the second end portion EP2 of each of the light emitting elements LD may be electrically connected to the second electrode ELT2 through the second contact electrode CNE2. In an embodiment, the first end portion EP1 of each of the light emitting elements LD may be electrically connected to the first electrode ELT1 by directly contacting the first electrode ELT1. Similarly, the second end portion EP2 of each of the light emitting elements LD may be electrically connected to the second electrode ELT2 by directly contacting the second electrode ELT2. In this case, the first contact electrode CNE1 and/or the second contact electrode CNE2 may be selectively formed.

The light emitting elements LD may be prepared in a form dispersed in a predetermined solution, and may be supplied to each pixel area (for example, the light emitting area EMA of each pixel PXL) through various methods including an inkjet method or a slit coating method. For example, the light emitting elements LD may be mixed with a volatile solvent and supplied to the light emitting area EMA of each pixel PXL. At this time, in a case that a predetermined alignment voltage (or an alignment signal) may be applied to the first and second electrodes ELT1 and ELT2 of the pixels PXL, an electric field may be formed between the first and second electrodes ELT1 and ELT2, and thus the light emitting elements LD may be aligned between the first and second electrodes ELT1 and ELT2. After the light emitting elements LD are aligned, the light emitting elements LD may be stably arranged or disposed between the first and second electrodes ELT1 and ELT2 by volatilizing the solvent or removing the solvent in or by other methods.

The first contact electrode CNE1 and the second contact electrode CNE2 may be formed or disposed on the both end portions of the light emitting elements LD, for example, the first and second end portions EP1 and EP2, respectively. Accordingly, the light emitting elements LD may be stably connected between the first and second electrodes ELT1 and ELT2.

The first contact electrode CNE1 may be disposed on the first electrode ELT1 and the first end portion EP1 of the light emitting element LD so as to overlap the first electrode ELT1 and the first end portion EP1 of at least one light emitting element LD adjacent to the first electrode ELT1. For example, the first contact electrode CNE1 may be disposed on the first electrode ELT1 and the first end portions EP1 of the light emitting elements LD so as to overlap the first electrode ELT1 and the first end portions EP1 of the plurality of light emitting elements LD adjacent to the first electrode ELT1.

The first contact electrode CNE1 may electrically connect the first electrode ELT1 and the first end portions EP1 of the light emitting elements LD. For example, the first contact electrode CNE1 may stably fix the first end portions EP1 of the light emitting elements LD.

The second contact electrode CNE2 may be disposed on the second electrode ELT2 and the second end portion EP2 of the light emitting element LD so as to overlap the second electrode ELT2 and the second end portion EP2 of at least one light emitting element LD adjacent to the second electrode ELT2. For example, the second contact electrode CNE2 may be disposed on the second electrode ELT2 and the second end portions EP2 of the light emitting elements LD so as to overlap the second electrode ELT2 and the second end portions EP2 of the plurality of light emitting elements LD adjacent to the second electrode ELT2.

The second contact electrode CNE2 may electrically connect the second electrode ELT2 and the second end portions EP2 of the light emitting elements LD. For example, the second contact electrode CNE2 may stably fix the second end portions EP2 of the light emitting elements LD.

Meanwhile, the pixel PXL may include a light emitting unit EMU of a series or series/parallel structure including a plurality of light emitting elements LD electrically connected to at least two series stages. In this case, the light emitting unit EMU may further include at least one intermediate electrode electrically connected between the first and second electrodes ELT1 and ELT2 through the light emitting elements LD, and/or at least one contact electrode for electrically connecting the intermediate electrode to adjacent light emitting elements LD.

In the above-described embodiment, each light emitting element LD electrically connected in the forward direction between the first and second electrodes ELT1 and ELT2 may form an effective light source of the corresponding pixel PXL. For example, such effective light sources may be gathered to form the light emitting unit EMU of the corresponding pixel PXL.

Referring to FIG. 4B, the pixel PXL may further include a first bank BNK1 overlapping the first and second electrodes ELT1 and ELT2, and a second bank BNK2 surrounding each light emitting area EMA.

The first bank BNK1 (also referred to as a "partition wall") may be disposed so as to overlap one region of the first and second electrodes ELT1 and ELT2. For example, the first bank BNK1 may be disposed under or below the first and second electrodes ELT1 and ELT2 so as to overlap one region of each of the first and second electrodes ELT1 and ELT2 on the plan view.

The first bank BNK1 may be for forming a wall structure around the light emitting elements LD, and may be formed in a separate or integral pattern. For example, the first bank BNK1 may include a (1-1)-th bank BNK1-1 and a (1-2)-th bank BNK1-2 separated from each other. The (1-1)-th bank BNK1-1 may overlap the first electrode ELT1 and the first contact electrode CNE1, and the (1-2)-th bank BNK1-2 may overlap the second electrode ELT2 and the second contact electrode CNE2. In an embodiment, the first bank BNK1 may be formed as an integral type bank of a shape surrounding a region in which the light emitting elements LD may be disposed while having an opening or a groove corresponding to the region in which the light emitting elements LD may be disposed.

In a case that the first bank BNK1 is disposed under or below one or a region of each of the first and second electrodes ELT1 and ELT2, the first and second electrodes ELT1 and ELT2 may protrude in an upward direction in a region in which the first bank BNK1 may be formed or disposed. The first bank BNK1 may form a reflective bank (also referred to as a "reflective partition wall") together with the first and second electrodes ELT1 and ELT2. For example, the first and second electrodes ELT1 and ELT2 and/or the first bank BNK1 may be formed of a reflective material, or may form a reflective film on the first and second electrodes ELT1 and ELT2 and/or a protruded sidewall of the first bank BNK1.

Accordingly, light emitted from the first and second end portions EP1 and EP2 of the light emitting elements LD facing the first and second electrodes ELT1 and ELT2 may be guided to be more directed to a front direction of the display panel PNL. Here, the front direction of the display panel PNL may include a direction perpendicular to the display panel PNL (for example, an upper direction of the pixel PXL), and may further comprehensively mean a direction belonging to a predetermined viewing angle range. As described above, in a case that one region of the first and second electrodes ELT1 and ELT2 is protruded in the upward direction using the first bank BNK1, light efficiency of the pixel PXL may be improved.

The second bank BNK2 may be a structure that defines the light emitting area EMA of each pixel PXL, and may be, for example, a pixel defining film. For example, the second bank BNK2 may be disposed in a boundary area of each pixel area PXA in which the pixel PXL is provided and/or an area between adjacent pixels PXL to surround the light emitting area EMA of each pixel PXL.

The second bank BNK2 may partially overlap the first and/or second electrodes ELT1 and ELT2 or may not overlap the first and/or second electrodes ELT1 and ELT2. For example, the first electrode ELT1 and/or the second electrode ELT2 may extend to a non-light emitting area NEA so as to overlap the second bank BNK2, or may be disconnected within the light emitting area EMA so as not to overlap the second bank BNK2.

For example, the second bank BNK2 may or may not overlap the first contact hole CH1 and/or the second contact hole CH2. For example, the first contact hole CH1 and/or the second contact hole CH2 may be formed in the non-light emitting area NEA so as to overlap the second bank BNK2, or may be formed in each light emitting area EMA so as not to overlap the second bank BNK2.

The second bank BNK2 may be formed to include at least one light-blocking and/or reflective material to prevent light leakage between adjacent pixels PXL. For example, the second bank BNK2 may include at least one black matrix material (for example, at least one light-blocking material) of various types of black matrix materials, a color filter material of a specific or predetermined color, and/or the like within the spirit and the scope of the disclosure. For example, the second bank BNK2 may be formed of a black opaque pattern to block light transmission.

For example, in supplying the light emitting elements LD to each pixel PXL, the second bank BNK2 may function as a dam structure defining each light emitting area EMA to which the light emitting elements LD is to be supplied. For example, each light emitting area EMA may be partitioned by the second bank BNK2, and thus a light emitting element ink of a desired type and/or amount may be supplied to the light emitting area EMA.

In an embodiment, the second bank BNK2 may be simultaneously formed or disposed on the same layer as the first banks BNK1 in a process of forming the first banks BNK1 of the pixels PXL. In an embodiment, the second bank BNK2 may be formed or disposed on a layer the same as or different from that of the first banks BNK1 through a process separate from the process of forming the first banks BNK1.

Figure 5A:
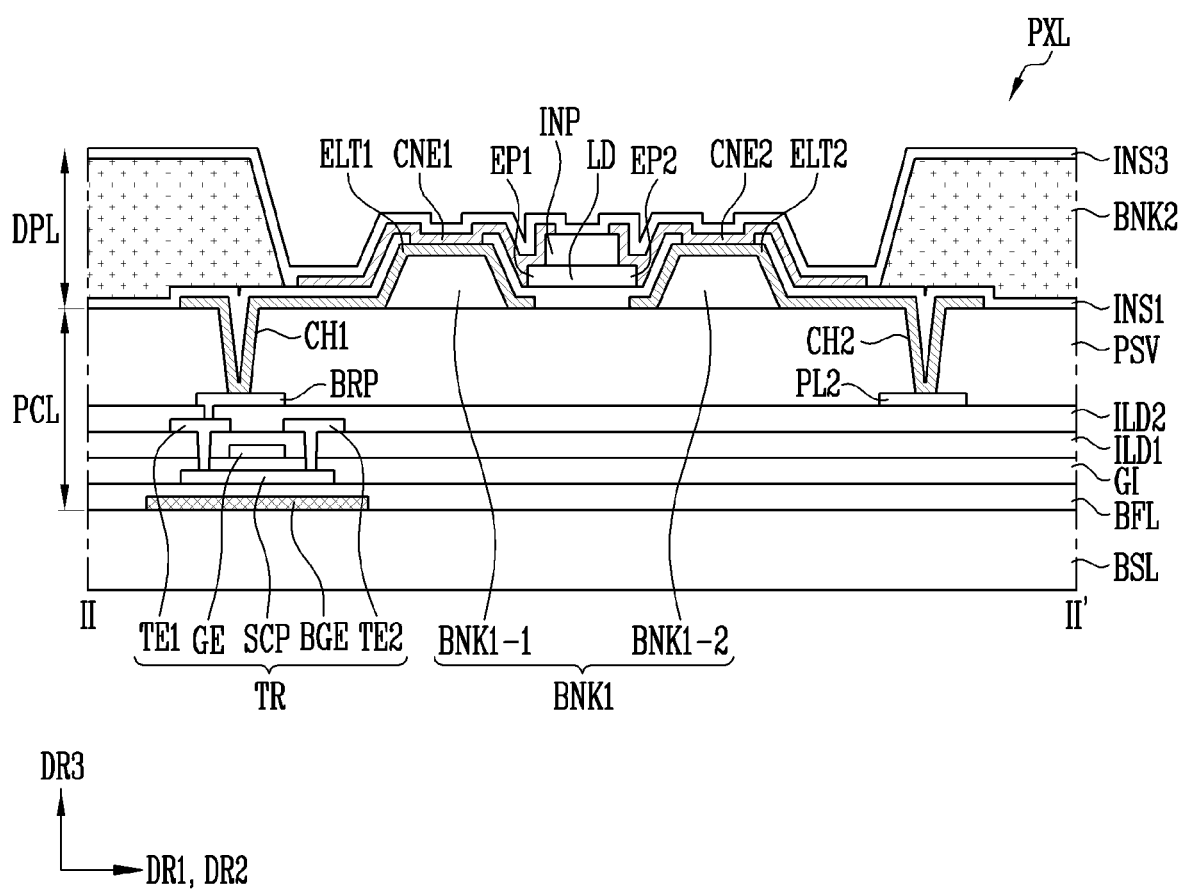
FIGS. 5A and 5B are schematic cross-sectional views illustrating the pixel of the display device according to an embodiment, respectively.
Figure 5B:
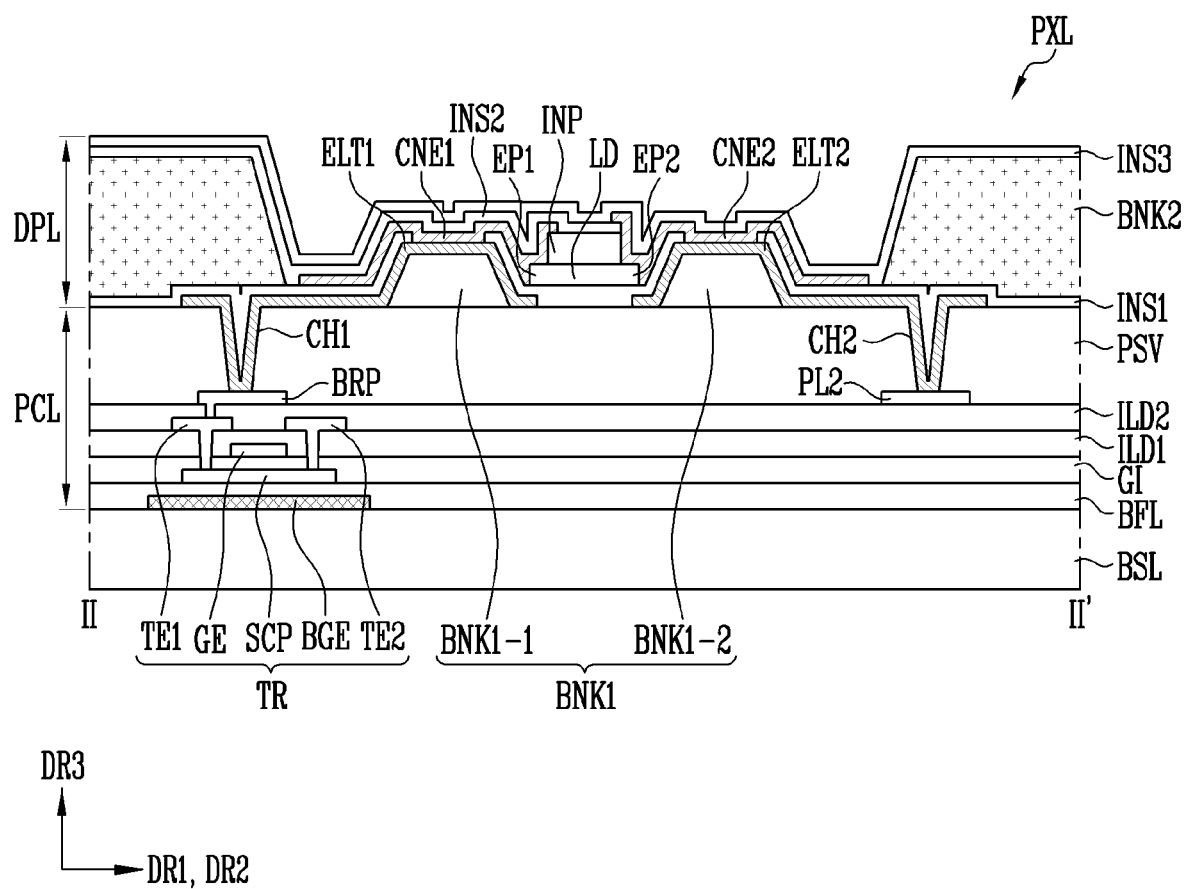

FIGS. 5A and 5B are schematic cross-sectional views illustrating the pixel PXL of the display device according to an embodiment, respectively. For example, FIGS. 5A and 5B illustrate different embodiments of a cross section of the pixel PXL along a line II~II' of FIG. 4B. In comparison with FIG. 5A, an embodiment of FIG. 5B may further include a second insulating layer INS2 disposed on the first contact electrode CNE1.

In FIGS. 5A and 5B, as an example of circuit elements that may be disposed on the circuit layer PCL, an arbitrary transistor TR (for example, a transistor electrically connected to the first electrode ELT1 through the first contact hole CH1 and the bridge pattern BRP) is shown. For example, as an example of a line that may be disposed on the circuit layer PCL, the second power line PL2 electrically connected to the second electrode ELT2 through the second contact hole CH2 is shown.

Referring to FIGS. 2 to 5B, the pixel PXL and the display device including the same according to an embodiment include the circuit layer PCL and the display layer DPL disposed to overlap each other on one surface of the base layer BSL. For example, the display area DA may include the circuit layer PCL sequentially disposed (stacked) in a third direction DR3 (for example, a height or thickness direction) on one surface of the base layer BSL, and the display layer DPL disposed on the circuit layer PCL. However, a mutual position of the circuit layer PCL and the display layer DPL on the base layer BSL may vary according to an embodiment.

The circuit elements (for example, the transistors TR and the storage capacitors Cst) forming the pixel circuit PXC of the corresponding pixel PXL and various lines electrically connected to the circuit elements may be disposed in each pixel area PXA of the circuit layer PCL. For example, the first and second electrodes ELT1 and ELT2, the light emitting elements LD, and/or the first and second electrodes CNE1 and CNE2 forming the light emitting unit EMU of the corresponding pixel PXL may be disposed in each pixel area PXA of the display layer DPL.

The circuit layer PCL may include a plurality of insulating layers in addition to the circuit elements and the lines. For example, the circuit layer PCL may include a buffer layer BFL, a gate insulating layer GI, a first interlayer insulating layer ILD1, a second interlayer insulating layer ILD2, and/or a passivation layer PSV sequentially stacked on one surface of the base layer BSL.

For example, the circuit layer PCL may selectively further include a first conductive layer including at least one light blocking layer (or a back gate electrode BGE of the transistor TR) or the like disposed under or below at least a portion of the transistor TR.

The buffer layer BFL may be disposed on one surface of the base layer BSL including the first conductive layer. The buffer layer BFL may prevent an impurity from diffusing into each circuit element.

A semiconductor layer may be disposed on the buffer layer BFL. The semiconductor layer may include a semiconductor pattern SCP of each transistor TR. The semiconductor pattern SCP may include a channel region overlapping a gate electrode GE, and first and second conductive regions (for example, source and drain regions) disposed on both sides of the channel region.

The gate insulating layer GI may be disposed on the semiconductor layer. For example, a second conductive layer may be disposed on the gate insulating layer GI.

The second conductive layer may include the gate electrode GE of each transistor TR. For example, the second conductive layer may further include one electrode and/or a predetermined line of the storage capacitor Cst.

The first interlayer insulating layer ILD1 may be disposed on the second conductive layer. For example, a third conductive layer may be disposed on the first interlayer insulating layer ILD1.

The third conductive layer may include first and second transistor electrodes TE1 and TE2 of each transistor TR. Here, the first and second transistor electrodes TE1 and TE2 may be source and drain electrodes SE and DE. For example, the third conductive layer may further include one electrode and/or a predetermined line of the storage capacitor Cst.

The second interlayer insulating layer ILD2 may be disposed on the third conductive layer. For example, a fourth conductive layer may be disposed on the second interlayer insulating layer ILD2.

The fourth conductive layer may include the bridge pattern BRP electrically connecting the circuit layer PCL and the display layer DPL and/or a predetermined line (for example, the first power line PL1 and/or the second power line PL2). The bridge pattern BRP may be electrically connected to the first electrode ELT1 of the light emitting unit EMU through the first contact hole CH1 or the like within the spirit and the scope of the disclosure. The second power line PL2 may be electrically connected to the second electrode ELT2 of the light emitting unit EMU through the second contact hole CH2 or the like within the spirit and the scope of the disclosure.

The passivation layer PSV may be disposed on the fourth conductive layer. According to an embodiment, the passivation layer PSV may include at least an organic insulating layer and may substantially planarize a surface of the circuit layer PCL. The display layer DPL may be disposed on the passivation layer PSV.

The display layer DPL may include the light emitting unit EMU of each pixel PXL. For example, the display layer DPL may include the first and second electrodes ELT1 and ELT2 disposed in the light emitting area EMA of each pixel PXL, the plurality of light emitting elements LD electrically connected between the first and second electrodes ELT1 and ELT2, and the first and second contact electrodes CNE1 and CNE2 electrically connecting the first and second electrodes ELT1 and ELT2 and the light emitting elements LD.

Meanwhile, FIGS. 5A and 5B show each light emitting element LD, as in the embodiments of FIGS. 3 to 4B, each pixel PXL may include the plurality of light emitting elements LD electrically connected in the forward direction between the first and second electrodes ELT1 and ELT2. Therefore, in describing embodiments of FIGS. 5A and 5B and other embodiments to be described later, each embodiment may be described under an assumption that the pixel PXL may include the plurality of light emitting elements LD.

For example, the display layer DPL may further include the first bank BNK1 for protruding one region of the first and second electrodes ELT1 and ELT2 in the upward direction, and the second bank BNK2 surrounding each light emitting area EMA. For example, the display layer DPL may further include at least one conductive layer, an insulating layer, and/or the like within the spirit and the scope of the disclosure.

For example, the display layer DPL may include the first bank BNK1, the first and second electrodes ELT1, ELT2, a first insulating layer INS1, the light emitting elements LD, an insulating pattern INP, the first and second contact electrodes CNE1 and CNE2, and a third insulating layer INS3 sequentially disposed and/or formed or disposed on the circuit layer PCL.

In an embodiment, the first and second contact electrodes CNE1 and CNE2 may be disposed on the same layer as shown in FIG. 5A. In an embodiment, the first and second contact electrodes CNE1 and CNE2 may be disposed separately in different layers as shown in FIG. 5B. In this case, the display layer DPL may further include a second insulating layer INS2 interposed between the first and second contact electrodes CNE1 and CNE2. For example, the second insulating layer INS2 may cover or overlap the first contact electrode CNE1, and one end of the second insulating layer INS2 may be interposed between the first contact electrode CNE1 and the second contact electrode CNE2.

Meanwhile, in a case of the second bank BNK2, a position on the cross section may vary according to an embodiment. In an embodiment, the second bank BNK2 may be formed or disposed on the first insulating layer INS1. In an embodiment, the second bank BNK2 may be disposed on the same layer as the first bank BNK1. For example, the second bank BNK2 may or may not overlap the first bank BNK1.

The first bank BNK1 may be disposed on one or a surface of the base layer BSL on which the circuit layer PCL may be selectively formed or disposed. The first bank BNK1 may protrude in the height direction of the base layer BSL on one surface of the base layer BSL on which the circuit layer PCL may be formed or disposed. Accordingly, one region of the first and second electrodes ELT1 and ELT2 disposed on the first bank BNK1 may protrude in the upward direction.

A reflective partition wall may be formed around the light emitting elements LD by the first bank BNK1 and the first and second electrodes ELT1 and ELT2 disposed on the first bank BNK1. Accordingly, the light efficiency of the pixel PXL may be improved.

The first bank BNK1 may have various shapes. In an embodiment, the first bank BNK1 may be formed to have an inclined surface inclined at a predetermined range of angle with respect to the base layer BSL as shown in FIGS. 5A and 5B. In an embodiment, the first bank BNK1 may have sidewalls such as a substantially curved surface or a substantially stepped shape. For example, the first bank BNK1 may have a cross section substantially of a semicircle or semi-ellipse shape, and the like within the spirit and the scope of the disclosure.

The first and second electrodes ELT1 and ELT2 forming pixel electrodes of each pixel PXL may be disposed on the first bank BNK1. According to an embodiment, the first and second electrodes ELT1 and ELT2 may have a shape substantially corresponding to the first bank BNK1. For example, the first and second electrodes ELT1 and ELT2 may protrude in the height direction of the base layer BSL by the first bank BNK1.

Each of the first and second electrodes ELT1 and ELT2 may include at least one conductive material. For example, the first and second electrodes ELT1 and ELT2 may include the same or different conductive materials. For example, each of the first and second electrodes ELT1 and ELT2 may be formed of a single layer or multiple layers.

The first insulating layer INS1 may be disposed on one region of the first and second electrodes ELT1 and ELT2. For example, the first insulating layer INS1 may be formed to cover or overlap one region of each of the first and second electrodes ELT1 and ELT2, and may include an opening exposing another region of each of the first and second electrodes ELT1 and ELT2. For example, the first insulating layer INS1 may include a plurality of openings formed on an upper surface of the first bank BNK1. In an embodiment, the first insulating layer INS1 may also include a plurality of contact holes formed at respective connection points, which may be for electrically connecting the first and second electrodes ELT1 and ELT2 to the first and second contact electrodes CNE1 and CNE2, respectively.

In a region where the first insulating layer INS1 is opened, the first and second electrodes ELT1 and ELT2 may be electrically connected to the first and second contact electrodes CNE1 and CNE2, respectively. Meanwhile, the first insulating layer INS1 may be omitted according to an embodiment. In this case, the light emitting elements LD may be directly disposed on one end of each of the passivation layer PSV and/or the first and second electrodes ELT1 and ELT2.

In an embodiment, the first insulating layer INS1 may be formed or disposed to entirely cover or overlap the first and second electrodes ELT1 and ELT2. After the light emitting elements LD may be supplied and aligned on the first insulating layer INS1, the first insulating layer INS1 may be partially opened to expose one or a region of the first and second electrodes ELT1 and ELT2. Since the first and second electrodes ELT1 and ELT2 may be formed or disposed and then covered or overlapped by the first insulating layer INS1 or the like, the first and second electrodes ELT1 and ELT2 may be prevented from being damaged in a subsequent process.

The light emitting elements LD may be supplied and aligned in the light emitting area EMA in which the first insulating layer INS1 or the like may be formed or disposed. Meanwhile, prior to the supply of the light emitting elements LD, the second bank BNK2 may be formed or disposed around the light emitting area EMA. For example, the second bank BNK2 may be formed or disposed in the display area DA to surround each light emitting area EMA.

In an embodiment, at least some or a predetermined number of the light emitting elements LD may be disposed in a horizontal direction, a diagonal direction, or the like between a pair of first and second electrodes ELT1 and ELT2 so that the both end portions (for example, the first and second end portions EP1 and EP2) of a longitudinal direction thereof overlap neighboring pair of first and second electrodes ELT1 and ELT2. In an embodiment, at least some or a predetermined number of the light emitting elements LD may be disposed between the neighboring pair of first and second electrodes ELT1 and ELT2 so as not to overlap the first and second electrodes ELT1 and ELT2, and may be electrically connected to the pair of first and second electrodes ELT1 and ELT2 through the first and second contact electrodes CNE1 and CNE2, respectively. For example, according to an embodiment, the light emitting elements LD may or may not overlap the first electrode ELT1 and/or the second electrode ELT2, and may be electrically connected between the first and second electrodes ELT1 and ELT2 by the first and second contact electrodes CNE1 and CNE2.

The insulating pattern INP may be disposed on one region of the light emitting elements LD. For example, the insulating pattern INP may be locally disposed on one region of the light emitting elements LD to expose the first and second end portions EP1 and EP2 of each of the light emitting elements LD.

The insulating pattern INP may be formed of a single layer or multiple layers, and may include at least one inorganic insulating material and/or organic insulating material. For example, the insulating pattern INP may include various types of organic/inorganic insulating materials including silicon nitride (SiNx) or silicon oxide (SiOx).

In a case that the insulating pattern INP may be formed or disposed on the light emitting elements LD after the alignment of the light emitting elements LD is completed, the light emitting elements LD may be prevented from deviating from an aligned position.

In an embodiment, in a case that a spaced apart space may be present between the first insulating layer INS1 and the light emitting elements LD due to a step difference formed by the first and second electrodes ELT1 and ELT2, the spaced apart space may be partially or completely filled by an insulating material flowed in a process of forming the insulating pattern INP. Accordingly, the light emitting elements LD may be more stably supported.

The both end portions of the light emitting elements LD, which may not be covered or overlap by the insulating pattern INP, for example, the first and second end portions EP1 and EP2, may be covered or overlapped by the first and second contact electrodes CNE1 and CNE2, respectively. The first and second contact electrodes CNE2 and CNE2 may be formed or disposed to be spaced apart from each other. For example, the first and second contact electrodes CNE1 and CNE2 may be disposed with the insulating pattern INP interposed therebetween, and may be disposed to be spaced apart from each other on the first and second end portions EP1 and EP2 of at least one light emitting element LD.

For example, the first and second contact electrodes CNE1 and CNE2 may be disposed on the first and second electrodes ELT1 and ELT2 to cover or overlap exposed regions of the first and second electrodes ELT1 and ELT2. For example, the first and second contact electrodes CNE1 and CNE2 may be disposed at least one region of each of the first and second electrodes ELT1 and ELT2 to be directly/indirectly in contact with each of the first and second electrodes ELT1 and ELT2 on the first bank BNK1 or around the first bank BNK1.

Accordingly, the first and second contact electrodes CNE1 and CNE2 may be electrically connected to the first and second electrodes ELT1 and ELT2, respectively. For example, each of the first and second electrodes ELT1 and ELT2 may be electrically connected to the first end portion EP1 or the second end portion EP2 of at least one adjacent light emitting element LD through the first and second contact electrodes CNE1 and CNE2.

In a case that the first and second contact electrodes CNE1 and CNE2 may be formed on the same layer as in an embodiment of FIG. 5A, the first and second contact electrodes CNE1 and CNE2 may be formed simultaneously in the same process, or may be sequentially formed, and the second insulating layer INS2 may be omitted. In this case, a manufacturing process of the pixel PXL may be simplified.

Meanwhile, as in an embodiment of FIG. 5B, the first and second contact electrodes CNE1 and CNE2 may be formed or disposed in different layers on one surface of the base layer BSL. For example, the second insulating layer INS2 may be interposed between the first and second contact electrodes CNE1 and CNE2.

The second insulating layer INS2 may be disposed to cover or overlap any one (for example, the first contact electrode CNE1) of the first and second contact electrodes CNE1 and CNE2. In a case that the insulating pattern INP and/or the second insulating layer INS2 may be formed or disposed on the light emitting elements LD, electrical stability between the first and second end portions EP1 and EP2 of the light emitting elements LD may be ensured. Accordingly, a short defect may be prevented from occurring between the first and second end portions EP1 and EP2 of the light emitting elements LD.

The first and second contact electrodes CNE1 and CNE2 may be formed of various transparent conductive materials. For example, the first and second contact electrodes CNE1 and CNE2 may include at least one of various transparent conductive materials including ITO, IZO, ITZO, ZnO, AZO, GZO, ZTO, GTO, and FTO, and may be implemented to be substantially transparent or translucent to satisfy a predetermined transmittance. Accordingly, the light emitted from the light emitting elements LD through each of the first and second end portions EP1 and EP2 may pass through the first and second contact electrodes CNE1 and CNE2 and may be emitted to the outside of the display panel PNL.

The third insulating layer INS3 may be disposed on the first and second contact electrodes CNE1 and CNE2. For example, third insulating layer INS3 may be entirely formed and/or disposed on the display area DA to cover or overlap the first and second banks BNK1 and BNK2, the first and second electrodes ELT1 and ELT2, the first and/or second insulating layers INS1 and/or INS2, the light emitting elements LD, the insulating pattern INP, and the first and second contact electrodes CNE1 and CNE2. The third insulating layer INS3 may include an inorganic film and/or organic film of at least one layer.

In an embodiment, the third insulating layer INS3 may include a thin film encapsulation layer of a multi-layer structure. For example, the third insulating layer INS3 may be formed of a thin film encapsulation layer of a multi-layer structure including inorganic insulating layers of a plurality of layers and an organic insulating layer of at least one layer interposed between the inorganic insulating layers. However, the configuration material and/or the structure of the third insulating layer INS3 may be variously changed. For example, according to an embodiment, an overcoat layer of at least one layer, a filler, an upper substrate, and/or the like may be further disposed on the third insulating layer INS3.

Figure 6:
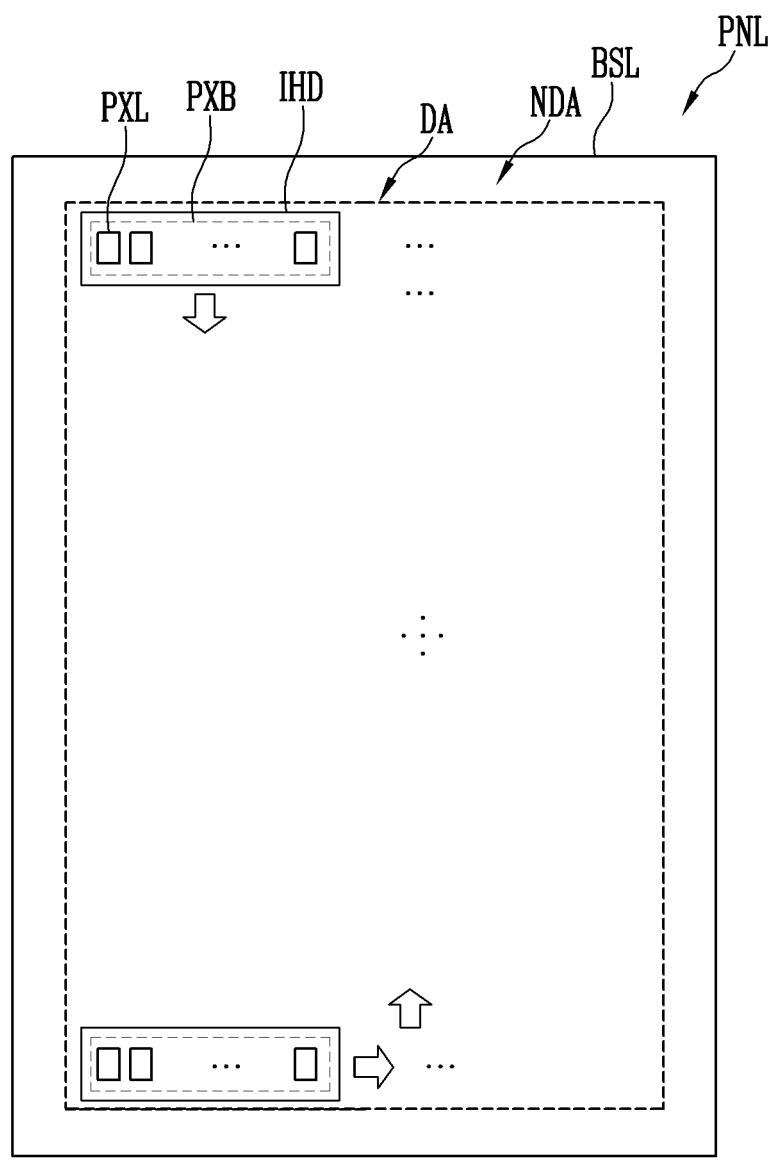
FIGS. 6 and 7 are a plan view and a schematic cross-sectional view illustrating a method of supplying the light emitting elements to the pixels according to an embodiment.
Figure 6:
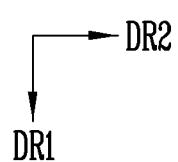
Figure 7:
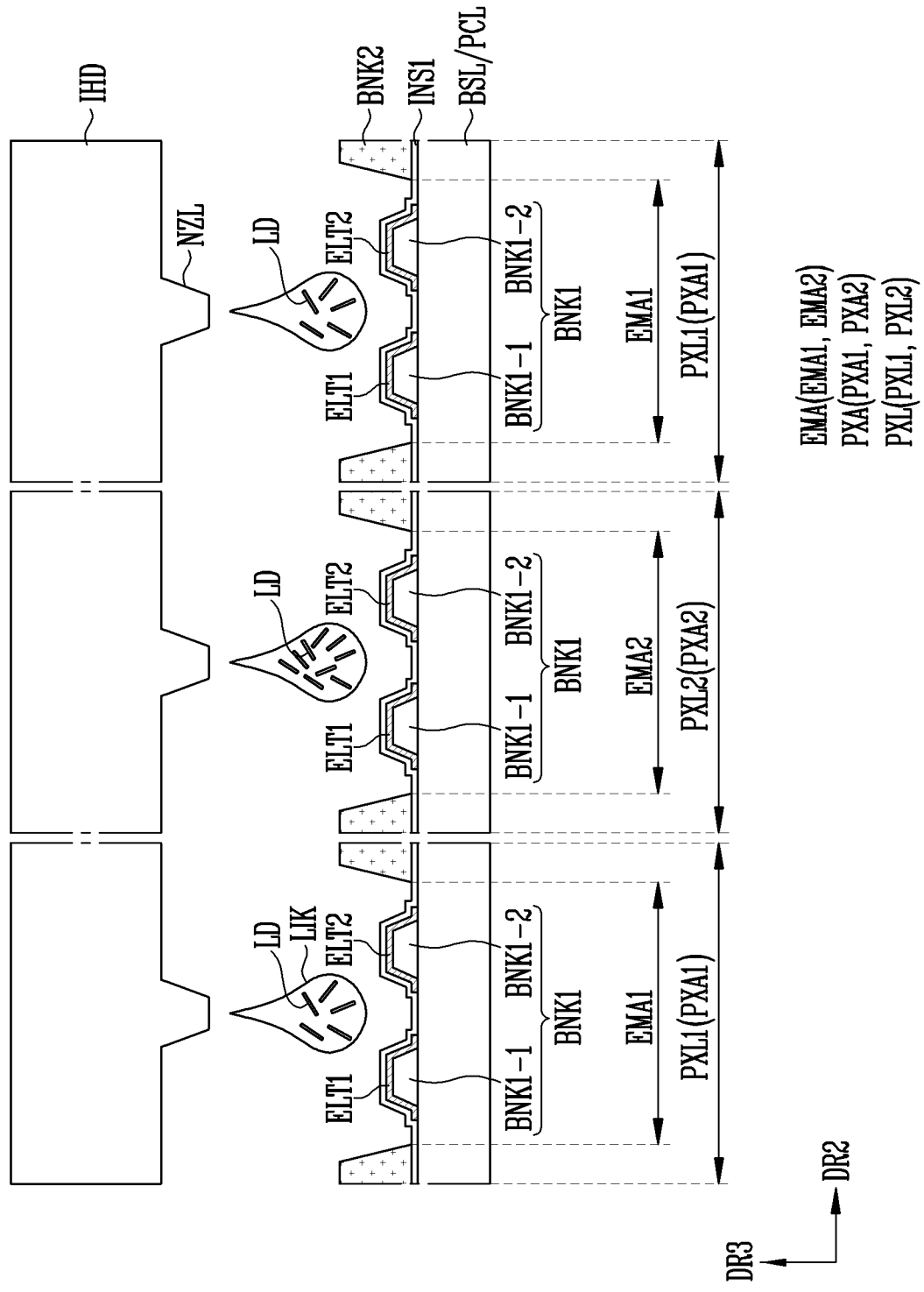

FIGS. 6 and 7 are a plan view and a schematic cross-sectional view illustrating a method of supplying the light emitting elements LD to the pixels PXL according to an embodiment. For example, FIGS. 6 and 7 illustrate an embodiment of a method of supplying the light emitting elements LD to each pixel PXL using inkjet printing equipment including an inkjet head IHD in which a plurality of nozzles NZL may be installed.

Referring to FIGS. 6 and 7, the inkjet head IHD may include the plurality of nozzles NZL to simultaneously supply the light emitting elements LD to the plurality of pixels PXL. For example, the inkjet head IHD may include the nozzles NZL corresponding to the plurality of pixels PXL sequentially arranged or disposed in one or a pixel row.

According to an embodiment, the nozzles NZL may be arranged or disposed at a pitch similar to or identical to that of the pixels PXL, and each nozzle NZL may supply a light emitting element ink LIK of a fixed quantity to each pixel PXL within a predetermined error range. Here, the light emitting element ink LIK may mean a solution in which a plurality of light emitting elements LD may be mixed.

The inkjet head IHD may sequentially supply the light emitting element ink LIK to pixel blocks PXB arranged or disposed in the display area DA while simultaneously supplying the light emitting element ink LIK to the pixels PXL in a unit of the pixel block PXB including the pixels PXL of the number corresponding to the number of nozzles NZL. In an embodiment, the inkjet head IHD may alternately move along the first direction DR1 and the second direction DR2 to supply the light emitting element ink LIK to all pixel areas PXA of the base layer BSL, on one or a surface of the base layer BSL on which the first and second electrodes ELT1 and ELT2 and the second bank BNK2 may be formed or disposed.

An average number of light emitting elements LD supplied to each pixel area PXA (for example, each light emitting area EMA) may vary by a concentration of the light emitting element ink LIK supplied to the pixel area PXA. For example, each pixel PXL may have an effective light source corresponding to (for example, proportional to) the number of light emitting elements LD supplied to a corresponding pixel area PXA. For example, as the number of light emitting elements LD supplied to each pixel area PXA increases, the number of light emitting elements LD electrically connected in the forward direction between the first and second electrodes ELT1 and ELT2 may be increased.

The number of effective light sources, for example, the number of light emitting elements LD electrically connected in the forward direction may affect a light emission characteristic of each pixel PXL. For example, in consideration of the area of the pixel area PXA and/or a probability of occurrence of a short defect, a supply amount of the light emitting element ink LIK may be adjusted so that the light emitting elements LD of a predetermined number range may be supplied to each pixel area PXA. Accordingly, each pixel PXL may include the light emitting elements LD that may not be saturated. In this case, even though a uniform driving current may flow through the pixels PXL in correspondence with each data voltage, in a case that a number deviation of the light emitting elements LD may occur, the pixels PXL may exhibit a luminance deviation. Therefore, in order for the pixels PXL disposed in the display area DA to exhibit a uniform luminance characteristic, the light emitting elements LD of a uniform number range may be required to be supplied to each pixel area PXA.

However, in a case that the inkjet head IHD may have a shape extending along one or a direction, for example, the second direction DR2, the concentration of the light emitting element ink LIK supplied to each nozzle NZL may decrease toward both ends of the inkjet head IHD. Accordingly, even though a uniform amount of light emitting element ink LIK may be supplied to the pixels PXL of each pixel block PXB, a relatively less number of light emitting elements LD may be supplied to the pixels PXL that may receive the light emitting element ink LIK from the nozzles NZL positioned or disposed at the both ends of the inkjet head IHD compared to the remaining pixels PXL. Thus, a streak stain may occur in the display area DA along a region where the both ends of the inkjet head IHD may pass.

In describing the following embodiment, each pixel PXL receiving a relatively less number of light emitting elements LD and thus including a relatively less number of light emitting elements LD may be referred to as a "first pixel PXL1". For example, each of the remaining pixels PXL except for the first pixels PXL1, which may be pixels PXL including a relatively great number of light emitting elements LD compared to the first pixels PXL1, may be referred to as a "second pixel PXL2".

For example, the pixels PXL may be divided into the first pixels PXL1 and the second pixels PXL2 according to a number range of the light emitting elements LD (for example, the effective light emitting elements LD) arranged or disposed in each light emitting area EMA and/or positions of each pixel PXL within each pixel block PXB. For example, the light emitting areas EMA of the first pixel PXL1 and the second pixel PXL2 may be referred to as a "first light emitting area EMA1" and a "second light emitting area EMA2", respectively, and the light emitting elements LD of the first pixel PXL1 and the second pixel PXL2 may be referred to as "first light emitting elements LD1" and "second light emitting elements LD2", respectively.

For example, the first pixel PXL1 and the second pixel PXL2 may be referred to by classifying the pixels PXL by different references separately from a color of each pixel PXL, and each first pixels PXL1 may be the first color pixel CPX1, the second color pixel CPX2, or the third color pixel CPX3. Similarly, each second pixel PXL2 may be the first color pixel CPX1, the second color pixel CPX2, or the third color pixel CPX3.

Meanwhile, in describing an embodiment, the pixels PXL may be divided to two groups of the first pixels PXL1 and the second pixels PXL2 according to the number range of the light emitting elements LD and/or the positions within the pixel block PXB, but the disclosure is not limited thereto. For example, in an embodiment, the pixels PXL may be divided into three or more groups by subdividing the number range of the light emitting elements LD included in each of the pixels PXL and/or the positions of the pixels PXL within each pixel block PXB.

As described above, in a case that a relatively less number of light emitting elements LD may be supplied to the first pixels PXL1 positioned at both ends of each pixel block PXB, the first pixels PXL1 may exhibit a relatively low luminance characteristic compared to the second pixels PXL2. For example, even though a data signal of the same voltage may be applied to the first pixels PXL1 and the second pixels PXL2, the first pixels PXL1 may emit light at a luminance lower than that of the second pixels PXL2. Accordingly, a luminance may be reduced in the first pixels PXL1 positioned at both end ends of the pixel blocks PXB, and thus a streak stain may occur in the display area DA.

In order to prevent the occurrence of such a streak stain, by supplying the light emitting element ink LIK to each pixel PXL over a plurality of times, a sufficient number of light emitting elements LD (the first light emitting elements LD1) may also be supplied to the first pixels PXL1. However, in this case, a possibility of occurrence of the short defect due to the light emitting elements LD may increase. Accordingly, in an embodiment to be described later, a method capable of easily alleviating or preventing a luminance deviation of the pixels PXL according to the number deviation of the light emitting elements LD without increasing the number of times the light emitting element ink LIK is supplied is proposed.

Figure 8:
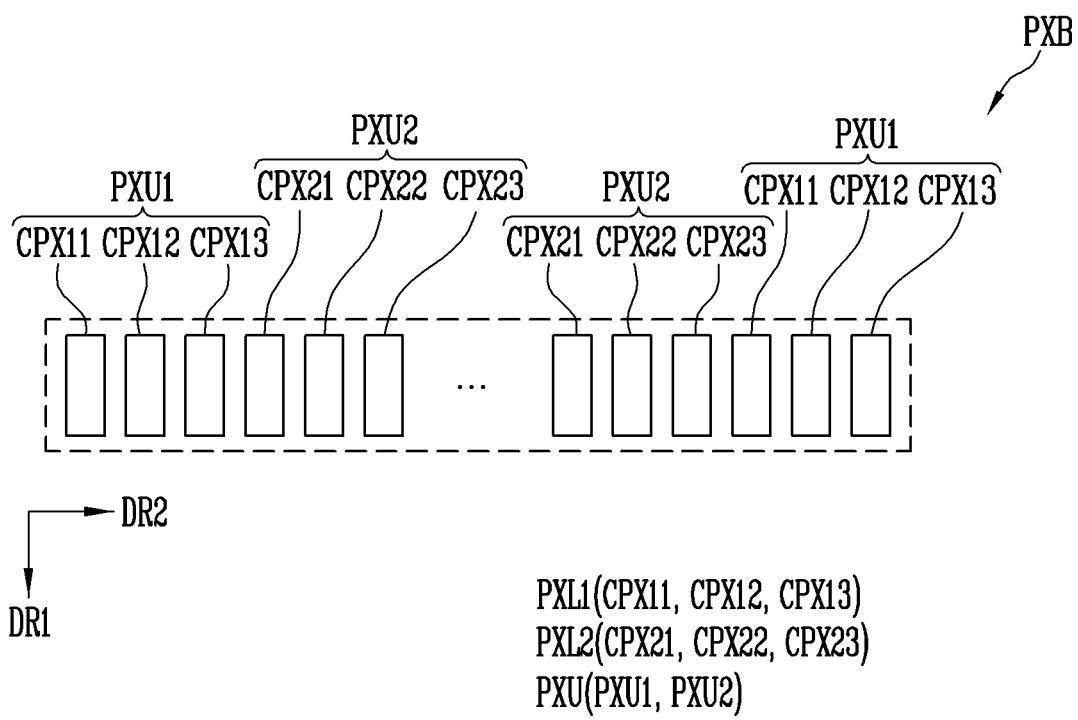
FIG. 8 is a plan view illustrating a pixel block according to an embodiment.

FIG. 8 is a plan view illustrating the pixel block PXB according to an embodiment. For example, FIG. 8 illustrates one pixel block PXB simultaneously receiving the light emitting elements LD by the nozzles NZL installed in the inkjet head IHD in an embodiment of FIGS. 6 and 7.

Figure 9A:
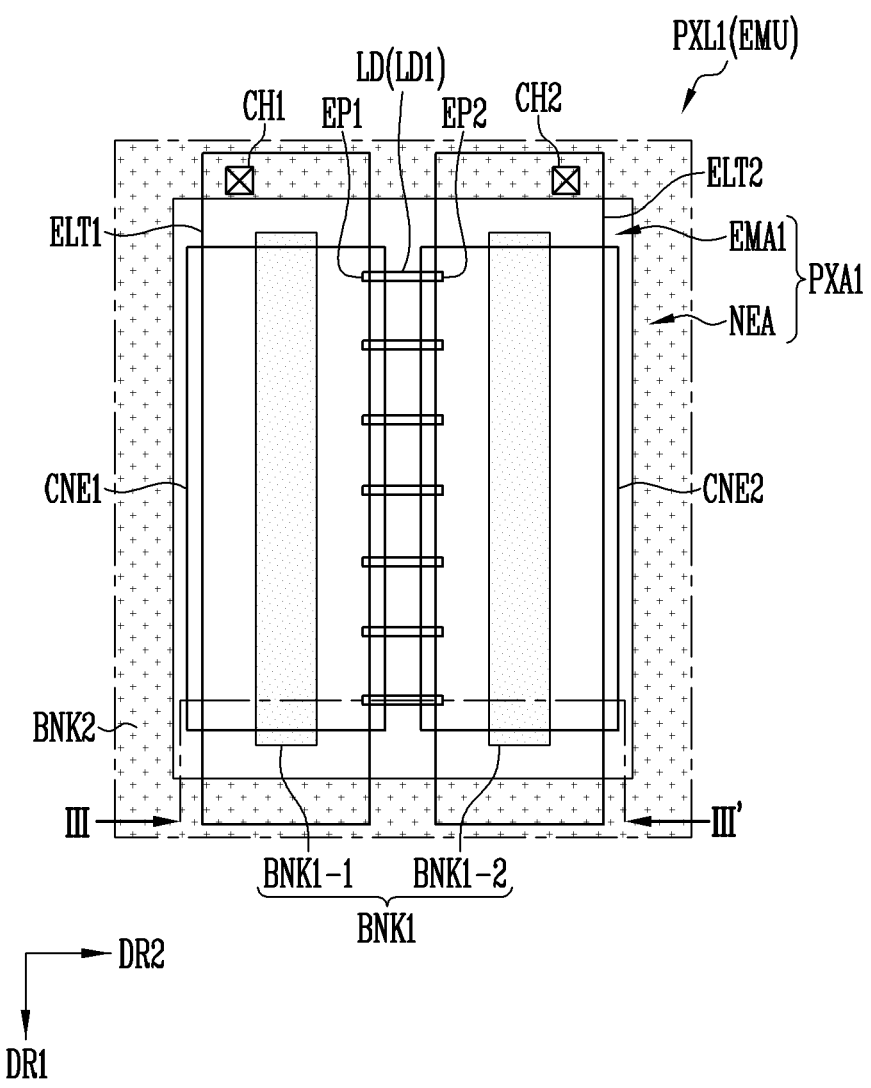
FIG. 9A is a plan view illustrating a first pixel of FIG. 8.

FIG. 9A is a plan view illustrating the first pixel PXL1 of FIG. 8, and FIG. 9B is a plan view illustrating the second pixel PXL2 of FIG. 8. For example, the first pixel PXL1 of FIG. 9A may be any one of the first color first pixel CPX11, the second color first pixel CPX12, and the third color first pixel CPX13 of FIG. 8, and the second pixel PXL2 of FIG. 9B may be any one of the first color second pixel CPX21, the second color second pixel CPX22, and the third color second pixel CPX23 of FIG. 8.

First, referring to FIG. 8, one first pixel unit PXU1 may be disposed at each of the both ends of the pixel block PXB, and second pixel units PXU2 may be disposed between the first pixel units PXU1. According to an embodiment, each first pixel unit PXU1 may include first pixels PXL1 of different colors, and each second pixel unit PXU2 may include second pixels PXL2 of different colors. For example, each first pixel unit PXU1 may include the first color first pixel CPX11, the second color first pixel CPX12, and the third color first pixel CPX13, and each second pixel unit PXU2 may include the first color second pixel CPX21, the second color second pixel CPX22, and the third color second pixel CPX23.

Meanwhile, in an embodiment, one first pixel unit PXU1 may be disposed at each of the both ends of the pixel block PXB, but the disclosure is not limited thereto. For example, the number of first pixel units PXU1 disposed at one or an end of the pixel block PXB may be changed. For example, at least two or more pixel units PXU may be classified as the pixel units PXU1 on at least one or an end of the pixel block PXB according to the number of light emitting elements LD arranged or disposed in each pixel PXL and/or a deviation range thereof.

For example, in an embodiment, the first pixels PXL1 and the second pixels PXL2 may be divided in a unit of the pixel unit PXU, but the disclosure is not limited thereto. For example, regardless of the color of each pixel PXL, at least one or more pixels PXL may be classified as the first pixel PXL1 on at least one end of the pixel block PXB according to the number of light emitting elements LD arranged or disposed in the pixel PXL and/or a deviation range thereof.

Referring to FIGS. 9A and 9B, each first pixel PXL1 (the first color first pixel CPX11, the second color first pixel CPX12, or the third color first pixel CPX13) may include the light emitting elements LD of a number less than that of each second pixel PXL2 (the first color second pixel CPX21, the second color second pixel CPX22, or the third color second pixel CPX23). For example, the first light emitting elements LD1 of a first number may be arranged or disposed in the pixel area PXA1 (for example, the first light emitting area EMA1) of the first pixel PXL1, and the second light emitting elements LD2 of a second number greater than the first number may be arranged or disposed in the pixel area PXA2 (for example, the second light emitting area EMA2) of the second pixel PXL2.

The first light emitting elements LD1 may be arranged or disposed in the forward direction between the first and second electrodes ELT1 and ELT2 in the first light emitting area EMA1. Accordingly, the first light emitting elements LD1 may form a light source of the first pixel PXL1.

The second light emitting elements LD2 may be arranged or disposed in the forward direction between the first and second electrodes ELT1 and ELT2 in the second light emitting area EMA2. Accordingly, the second light emitting elements LD2 may form a light source of the second pixel PXL2.

According to an embodiment, a light blocking pattern covering or overlapping a peripheral area of the first and second light emitting areas EMA1 and EMA2, which is the non-light emitting area NEA may be disposed on the first and second pixels PXL1 and PXL2. The light blocking pattern may be opened by different areas on the first pixel PXL1 and the second pixel PXL2 a luminance deviation of the first and second pixels PXL1 and PXL2 according to the number deviation of the first and second light emitting devices LD1 and LD2 may be reduced or canceled. Meanwhile, in a case that the pixels PXL may be divided into three or more groups by more subdividing the number range of the light emitting elements LD included in each of the pixels PXL and/or the positions of the pixels PXL, different aperture ratios may be applied to the three or more groups. An embodiment related to a method of adjusting the aperture ratio of the pixels PXL is described later.

Figure 10A:
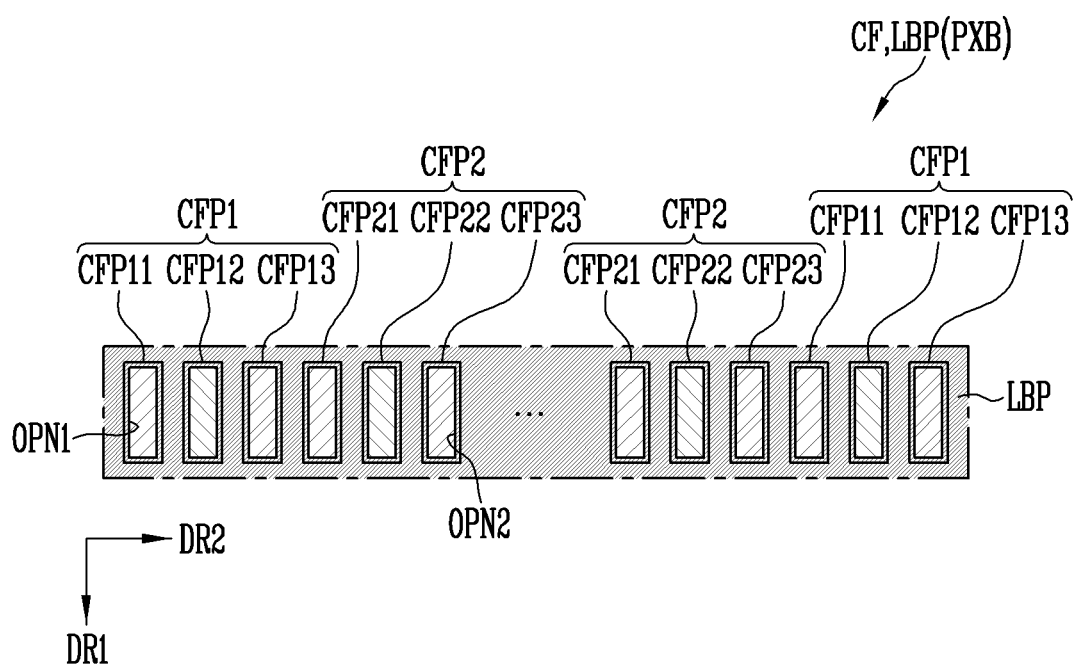
FIGS. 10A to 10E are plan views each illustrating a color filter and a light blocking pattern according to an embodiment.
Figure 10B:
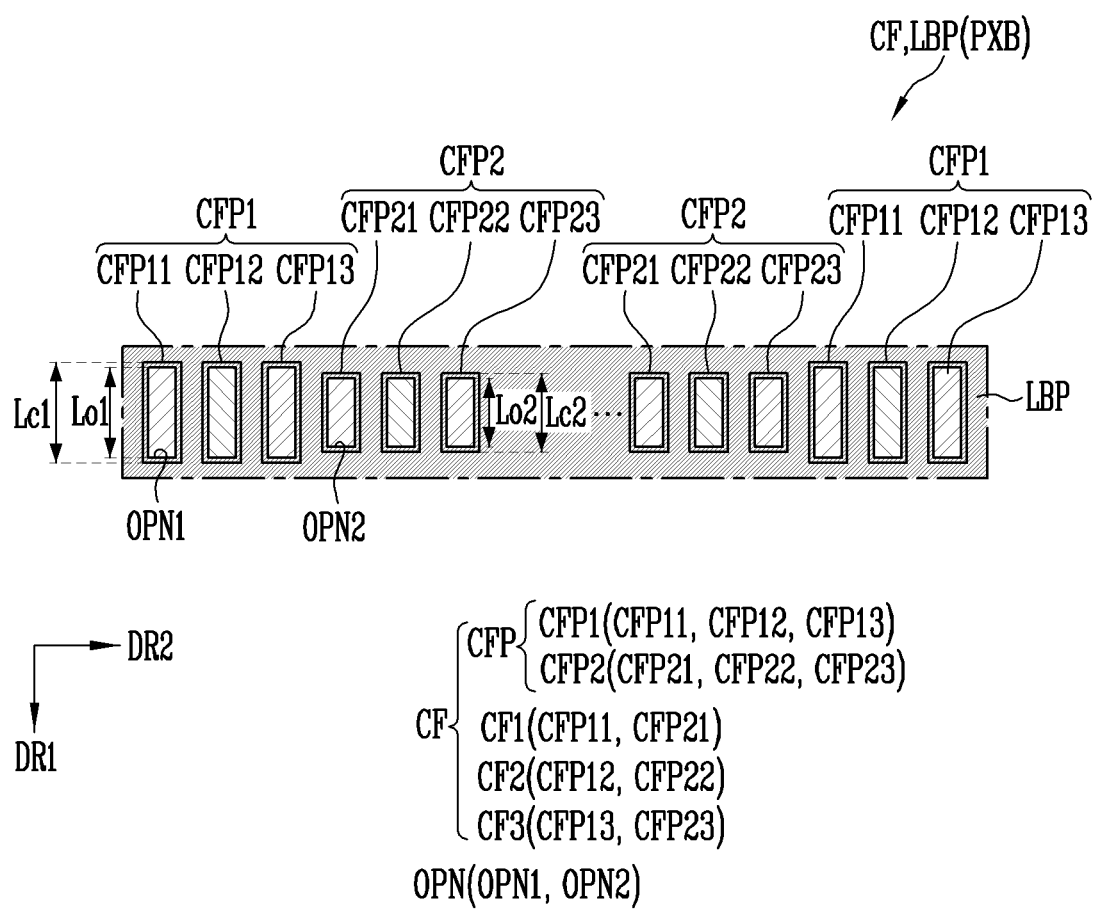
Figure 10C:
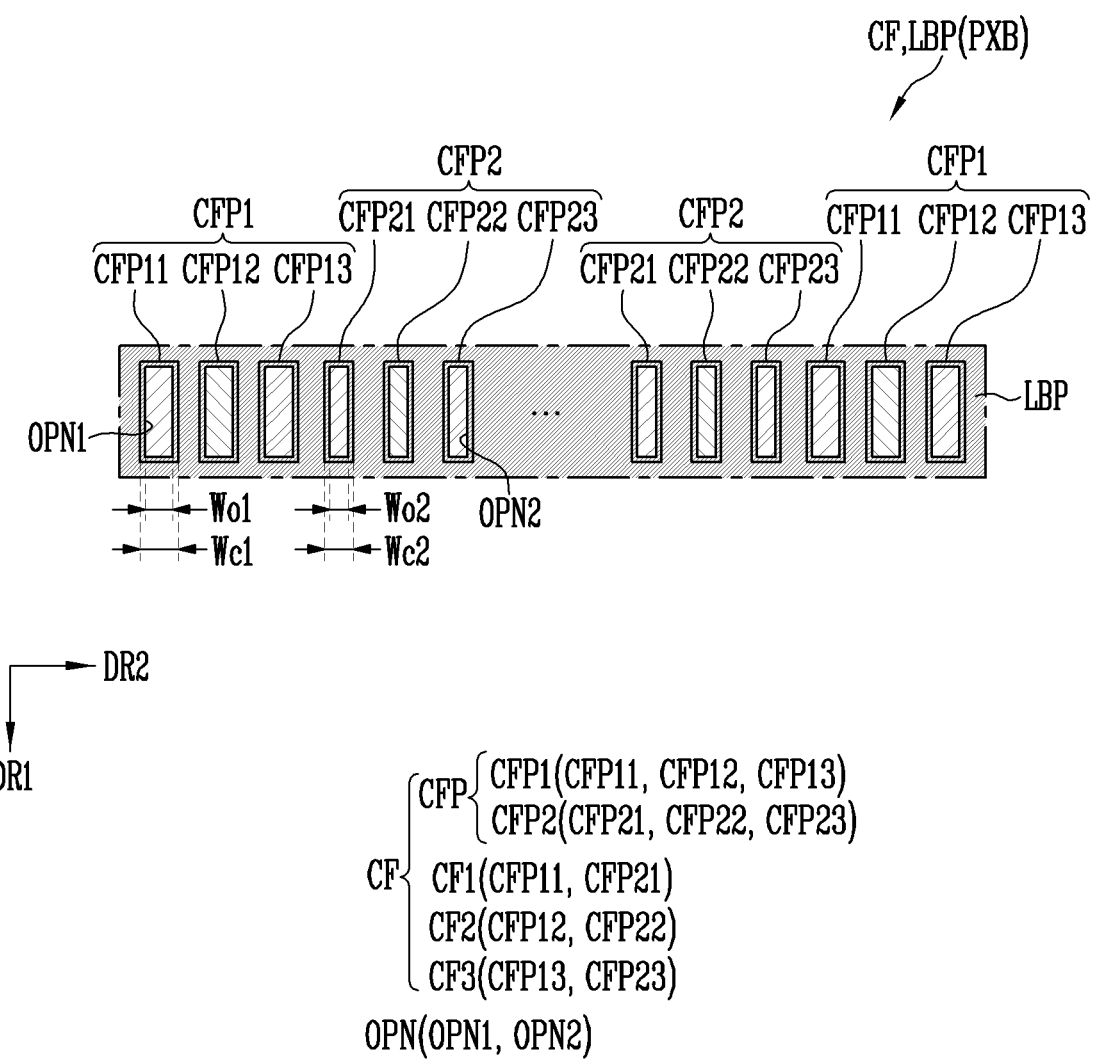
Figure 10D:
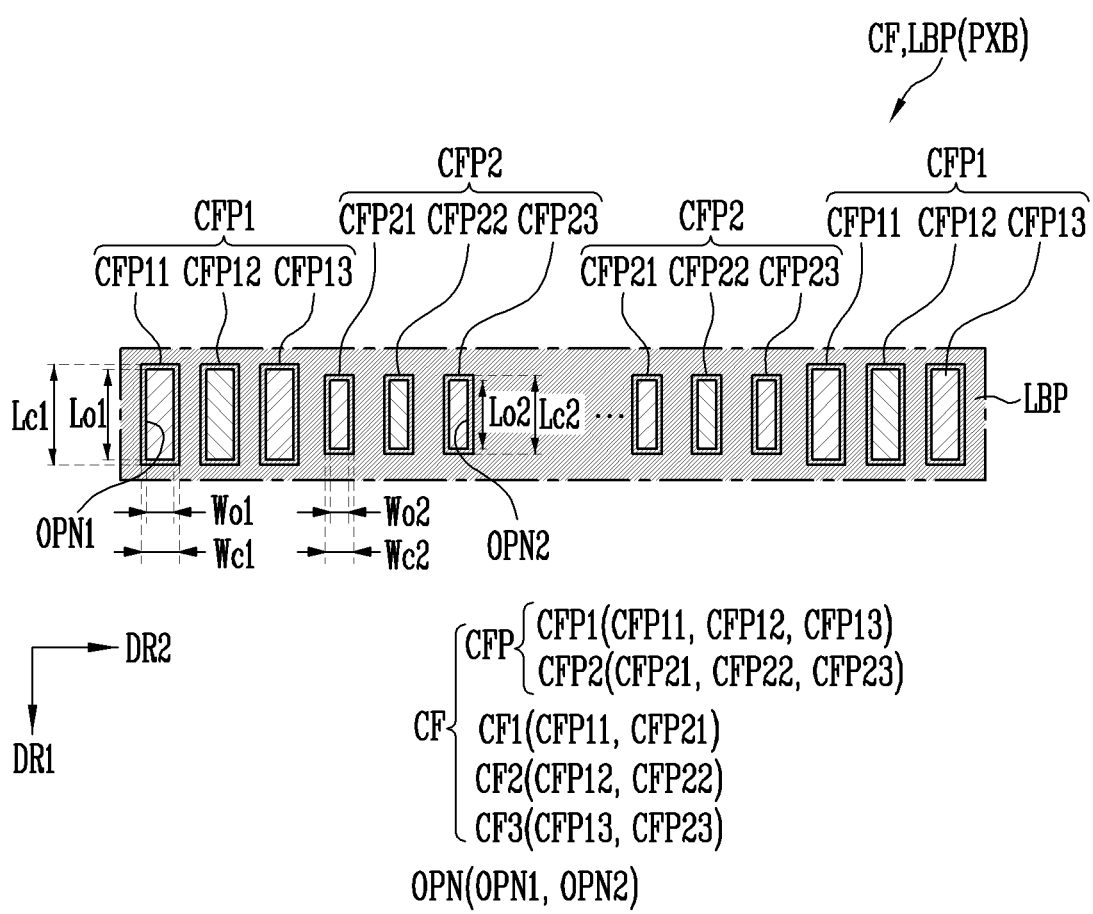
Figure 10E:
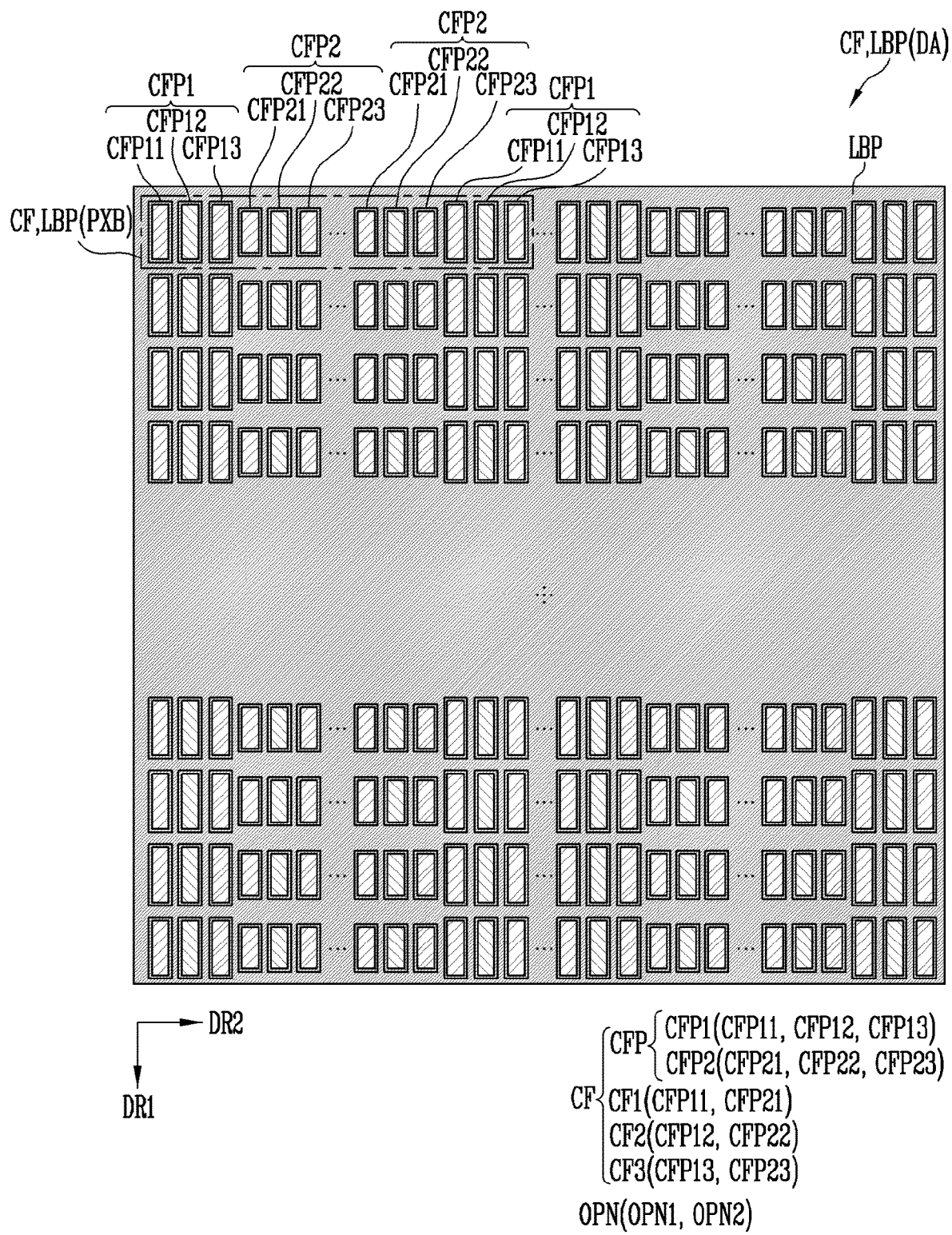

FIGS. 10A to 10E are plan views each illustrating a color filter CF and a light blocking pattern LBP according to an embodiment. For example, FIGS. 10A to 10D illustrate different embodiments of the color filter CF and the light blocking pattern LBP that may be disposed on the pixel block PXB of FIG. 8. For example, FIG. 10E illustrates a structure in which the color filter CF and the light blocking pattern LBP according to any one of the embodiments of FIGS. 10A to 10D, for example, an embodiment of FIG. 10B is disposed in the display area DA of FIG. 6.

First, referring to FIGS. 6 to 10A, the light blocking pattern LBP may include a plurality of openings OPN separated and opened to correspond to the light emitting area EMA of each pixel PXL. For example, the light blocking pattern LBP may include first openings OPN1 corresponding to the first light emitting areas EMA1 of the first pixels PXL1 and second openings OPN2 corresponding to the second light emitting areas EMA2 of the second pixels PXL2, and may be disposed on the first and second pixels PXL1 and PXL2 to cover or overlap the peripheral area of the first and second light emitting areas EMA1 and EMA2. For example, the light blocking pattern LBP may include first openings OPN1 exposing the first light emitting areas EMA1 of the first to third color first pixels CPX11, CPX12, and CPX13 and second openings OPN2 exposing the second light emitting areas EMA2 of the first to third color second pixels CPX21, CPX22, and CPX23, and may be disposed on the first and second pixels PXL1 and PXL2 to cover or overlap an edge area of the first and second light emitting areas EMA1 and EMA2 and/or the non-light emitting area NEA around or adjacent to the edge area.

The openings OPN of the light blocking pattern LBP may have a shape and/or a size substantially corresponding to each pixel area PXA, for example, each light emitting area EMA. For example, each of the first and second openings OPN1 and OPN2 may have a shape extending along the first direction DR1 and may be arranged or disposed spaced apart from each other along the second direction DR2 in a region corresponding to each pixel block PXB.

The color filter pattern CFP corresponding to each pixel PXL may be disposed in each opening OPN of the light blocking pattern LBP. For example, first color filter patterns CFP1 corresponding to a color of each first pixel PXL1 may be disposed in the first openings OPN1 on the first pixels PXL1, and second color filter patterns CFP2 corresponding to a color of each second pixel PXL2 may be disposed in the second openings OPN2 on the second pixels PXL2.

For example, a first color first color filter pattern CFP11, a second color first color filter pattern CFP12, and a third color first color filter pattern CFP13 may be disposed in the first openings OPN1 positioned or disposed on the first color first pixel CPX11, the second color first pixel CPX12, and the third color first pixel CPX13, respectively. For example, a first color second pixel CPX21, a second color second pixel CPX22, and a third color second pixel CPX23 may be disposed in the second openings OPN2 positioned or disposed on the first color second pixel CPX21, the second color second pixel CPX22, and the third color second pixel CPX23, respectively.

The first and second color filter patterns CFP1 and CFP2 may have a shape and/or a size substantially corresponding to each pixel area PXA, for example, each light emitting area EMA. For example, each of the first and second color filter patterns CFP1 and CFP2 may have a shape extending along the first direction DR1 and may be arranged or disposed spaced apart from each other along the second direction DR2 in the region corresponding to each pixel block PXB.

Meanwhile, in a case that dividing the color filter patterns CFP based on each color regardless of the first and second pixels PXL1 and PXL2, the color filter patterns CFP may be collectively referred to as first, second, or third color filters CF1, CF2, or CF3. For example, a color filter pattern of a first color (for example, the first color first color filter pattern CFP11 and the first color second color filter pattern CFP21) may be collectively referred to as the "first color filter CF1", a color filter pattern of a second color (for example, the second color first color filter pattern CFP12 and the second color second color filter pattern CFP22) may be collectively referred to as the "second color filter CF2", and a color filter pattern of a third color (for example, the third color first color filter pattern CFP13 and the third color second color filter pattern CFP23) may be collectively referred to as the "third color filter CF3". For example, the first color filter CF1 may be disposed on each first color pixel CPX1, the second color filter CF2 may be disposed on each second color pixel CPX2, and the third color filter CF3 may be disposed on each third color pixel CPX3.

In an embodiment, the first and second pixels PXL1 and PXL2 may have a uniform aperture ratio. For example, the light blocking pattern LBP may be opened in a uniform size (for example, a uniform area) on each of the first pixel PXL1 and the second pixel PXL2 regardless of the division of the first and second pixels PXL1 and PXL2. In this case, the first and second openings OPN1 and OPN2 may have a uniform size in the entire display area DA. For example, the first and second color filter patterns CFP1 and CFP2 may have a size corresponding to each opening OPN, and thus the first and second color filter patterns CFP1 and CFP2 may have a uniform size in the entire display area DA.

In an embodiment, the first and second pixels PXL1 and PXL2 may have a uniform aperture ratio, and may have an aperture ratio adjusted for each color group in consideration of light emission efficiency, white balance, a visibility characteristic, and/or the like according to external light reflection. For example, the first color first pixel CPX11, the second color first pixel CPX12, and/or the third color first pixel CPX13 forming each first pixel unit PXU1 may have different aperture ratios. Similarly, the first color second pixel CPX21, the second color second pixel CPX22, and/or the third color second pixel CPX23 forming each second pixel unit PXU2 may have different aperture ratios. For example, the light blocking pattern LBP may have openings OPN of different sizes (areas) for each color group of the pixels PXL. In this case, the color filters CF disposed in each opening OPN may also have different sizes (areas) for each color group. For example, the first color filter CF1, the second color filter CF2, and/or the third color filter CF3 may have different sizes.

According to an embodiment, the pixels PXL of the same color may have a uniform aperture ratio. For example, the first color first pixel CPX11 and the first color second pixel CPX21 may have substantially the same or similar aperture ratio, the second color first pixel CPX12 and the second color second pixel CPX22 may have substantially the same or similar aperture ratio, and the third color first pixel CPX13 and the third color second pixel CPX23 may have substantially the same or similar aperture ratio.

In an embodiment of FIG. 10A, regardless of the division of the first and second pixels PXL1 and PXL2, the pixels PXL may have generally uniform aperture ratio or an aperture ratio adjusted for each color group. However, in this case, a luminance deviation between the first and second pixels PXL1 and PXL2 may occur due to the number variation of the light emitting elements LD arranged or disposed in the first and second pixels PXL1 and PXL2, and thus image quality of the display device may be reduced.

Accordingly, in an embodiment, the aperture ratio of the first and second pixels PXL1 and PXL2 may be adjusted so that the luminance deviation between the first and second pixels PXL1 and PXL2 may be reduced or prevented.

Referring to FIGS. 6 to 9B and 10B to 10E, within at least one color group, the first pixels PXL1 and the second pixels PXL2 may have different aperture ratios. For example, according to an embodiment, regardless of the color group, the first pixels PXL1 and the second pixels PXL2 may have different aperture ratios. For example, in an embodiment, the aperture ratios of the first pixels PXL1 and the second pixels PXL2 may be set differentially so that the luminance deviation between the first and second pixels PXL1 and PXL2 due to the number variation of the light emitting elements LD may be reduced or prevented.

For example, within a specific or predetermined color group or a plurality of color groups, the second pixel PXL2 including the second light emitting elements LD2 of the number greater than that of the first light emitting elements LD1 arranged or disposed in the first pixel PXL1 may have an aperture ratio lower than that of the first pixel PXL1. For example, each second opening OPN2 disposed on each second pixel PXL2 may have the area less than that of each first opening OPN1 disposed on each first pixel PXL1. To this end, in at least one of the first direction DR1 and the second direction DR2, the second openings OPN2 may have a length (and/or a width) shorter than that of the first openings OPN1.

For example, the second openings OPN2 may have a length Lo2 shorter than a length Lo1 of the first openings OPN1 in the first direction DR1 which may be a long side as shown in FIGS. 10B and 10E. In an embodiment, the second openings OPN2 may have a width Wo2 shorter than a width Wo1 of the first openings OPN1 on the second direction DR2 which may be a short side direction as shown in FIG. 10C. In an embodiment, the second openings OPN2 may have the length Lo2 shorter than the length Lo1 of the first openings OPN1 on the first direction DR1 and may have the width Wo2 shorter than the width Wo1 of the first openings OPN1 on the second direction DR2 as shown in FIG. 10D.

Similarly, within a specific or predetermined color group or a plurality of color groups, each second color filter pattern CFP2 disposed on each second pixel PXL2 may have the area less than that of each first color filter pattern CFP1 disposed on each first pixel PXL1. To this end, in at least one of the first direction DR1 and the second direction DR2, the second color filter patterns CFP2 may have a length (and/or a width) shorter than that of the first color filter patterns CFP1.

For example, the second color filter patterns CFP2 may have a length Lc2 shorter than a length Lc1 of the first color filter patterns CFP1 on the first direction DR1 as shown in FIGS. 10B and 10E. In an embodiment, the second color filter patterns CFP2 may have a width Wc2 shorter than a width Wc1 of the first color filter patterns CFP1 in the second direction DR2 as shown in FIG. 10C. In an embodiment, the second color filter patterns CFP2 may have the length Lc2 shorter than the length Lc1 of the first color filter patterns CFP1 in the first direction DR1 and may have the width Wc2 shorter than the width Wc1 of the first color filter patterns CFP1 in the second direction DR2 as shown in FIG. 10D.

The display device according to the above-described embodiment may include the first pixel PXL1 and the second pixel PXL2 including different numbers of light emitting elements LD, and the light blocking pattern LBP opened by a less area on the pixel PXL (for example, the second pixel PXL2) including a larger number of light emitting elements LD. The luminance of each pixel PXL may be proportional to the number of the light emitting elements LD and the aperture ratio. Therefore, in a case that the aperture ratio of the pixel PXL including the larger number of light emitting elements LD is relatively decreased, and/or the aperture ratio of the pixel PXL including the less number of light emitting elements LD is relatively increased, the luminance deviation of the pixels PXL may be reduced or prevented.

For example, in the above-described embodiment, the aperture ratio of the pixels PXL may be adjusted according to the number deviation of the light emitting elements LD arranged or disposed in each pixel PXL. Accordingly, by causing the luminance of the pixels PXL to be uniform, the streak stain may be prevented and the image quality of the display device may be improved.

Figure 11A:
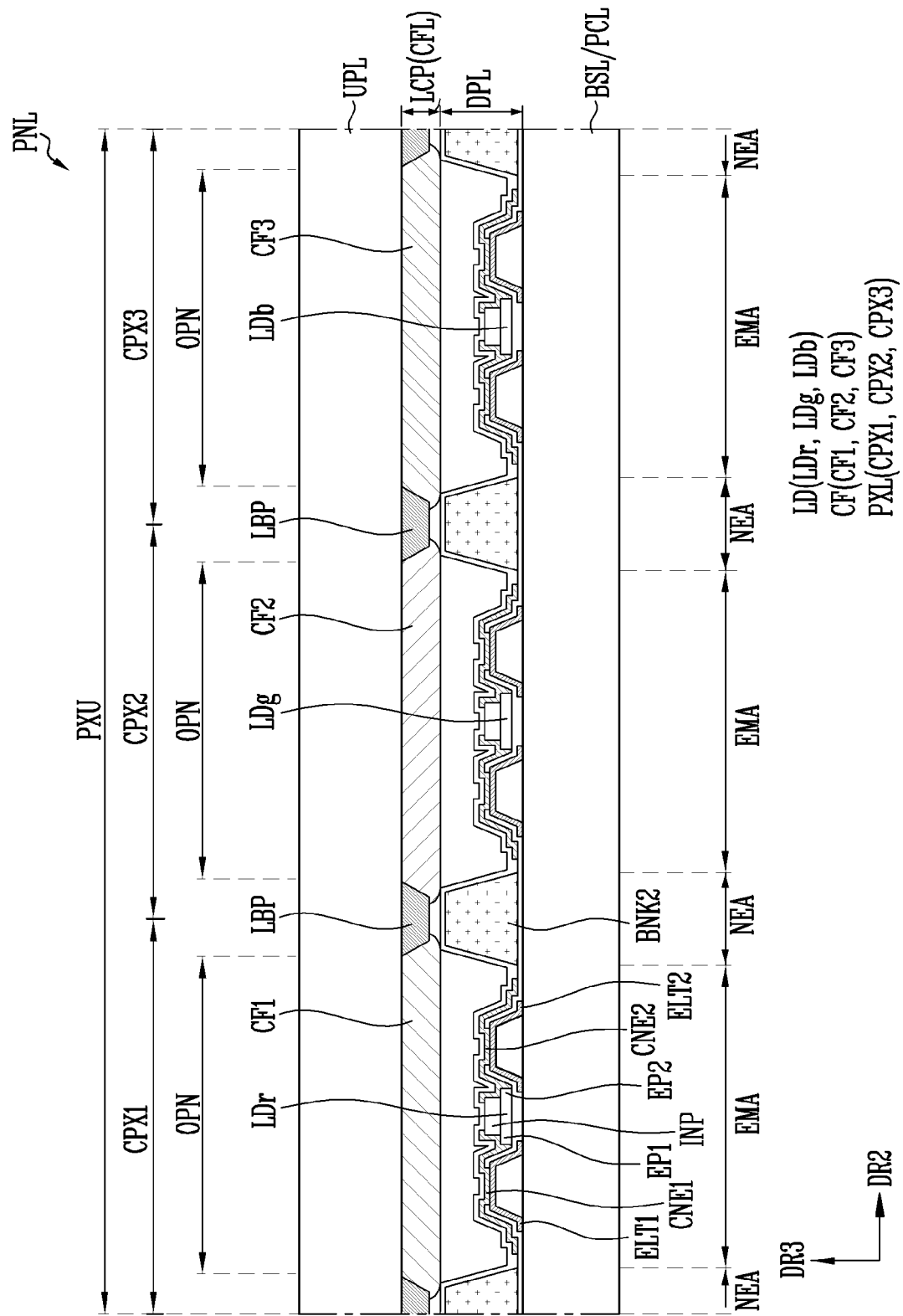
FIGS. 11A and 11B are schematic cross-sectional views each illustrating the display device according to an embodiment.
Figure 11B:
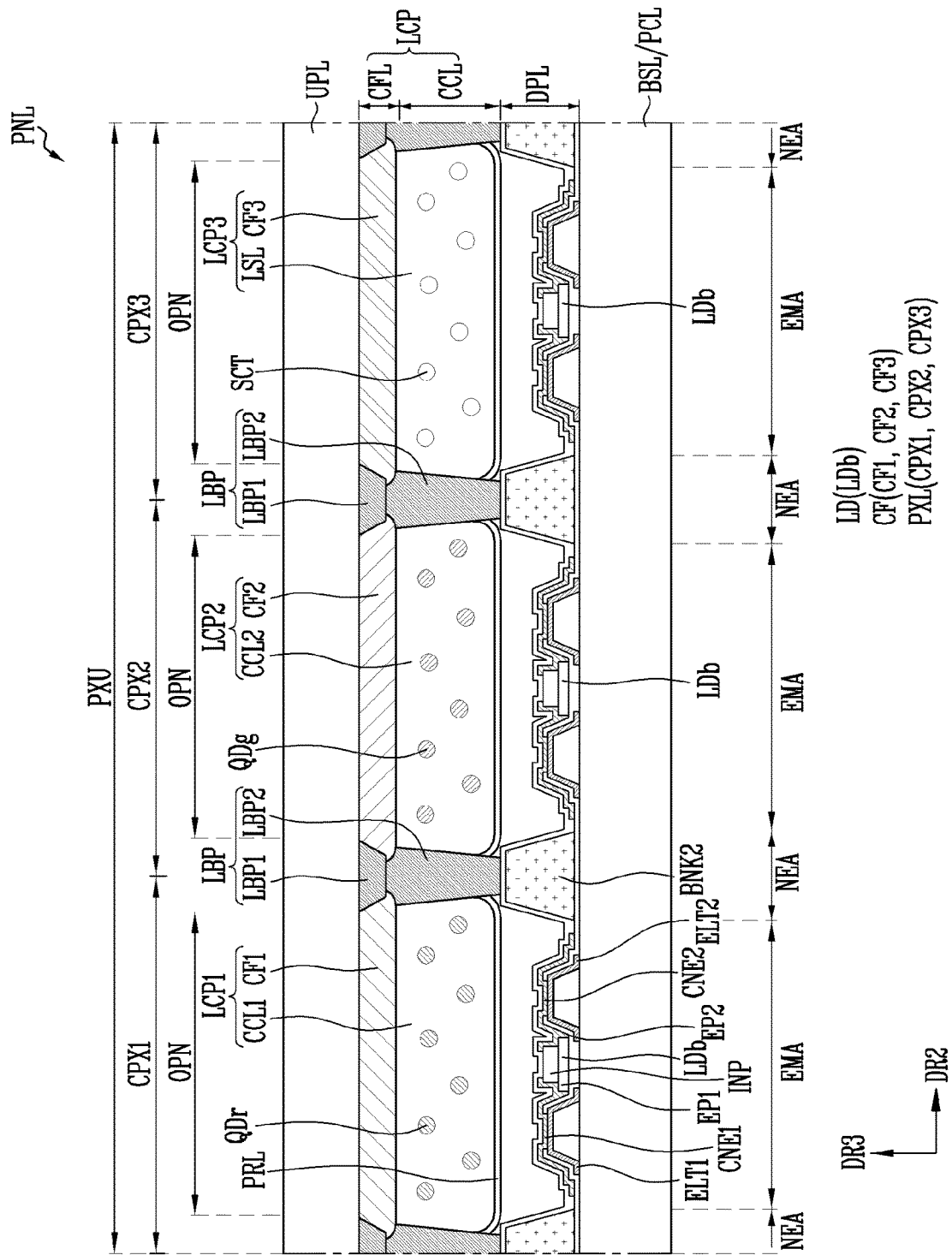

FIGS. 11A and 11B are schematic cross-sectional views each illustrating the display device according to an embodiment. For example, FIG. 11A discloses an embodiment of a display panel PNL that does not include color conversion particles (for example, red and green quantum dots QDr and QDg), and FIG. 11B disclosure an embodiment of a display panel PNL including the color conversion particles. For example, the display device according to the disclosure may selectively include the color conversion particles disposed on the pixels PXL.

In FIGS. 11A and 11B, a cross section of the display panel PNL is shown, based on a region in which one pixel unit PXU formed of the first color pixel CPX1, the second color pixel CPX2, and the third color pixel CPX3 adjacent to each other is disposed. Meanwhile, since the example structure of each pixel PXL has been described in detail through the above-described embodiments, the structure of each pixel PXL is schematically shown in FIGS. 11A and 11B, and detailed description thereof may be omitted. For example, FIGS. 11A and 11B schematically show the cross section along the second direction DR2 with respect to the display panel PNL on which the pixel unit PXU shown in FIG. 2 may be disposed.

First, referring to FIGS. 2 to 11A, the light emitting unit EMU of each pixel PXL may be disposed on the display layer DPL on the base layer BSL and/or the circuit layer PCL. For example, the light emitting unit EMU of the corresponding pixel PXL may be disposed in each light emitting area EMA of the display layer DPL. For example, in each light emitting area EMA, the first and second pixel electrodes ELT1 and ELT2, the light emitting elements LD, the first and second contact electrodes CNE1 and CNE2, and the first and the second banks BNK1 and BNK2 may be disposed, and at least one insulating layer may be further disposed. For example, an overcoat layer, a filler, or the like may be selectively disposed on the display layer DPL.

In an embodiment, the first, second, and third color pixels CPX1, CPX2, and CPX3 may include light emitting elements LD that emit light of different colors. For example, the first color, second color, and third color pixels CPX1, CPX2, and CPX3 may include first color light emitting elements LDr, second color light emitting elements LDg, and third color light emitting elements LDb, respectively.

The first color light emitting elements LDr may be red light emitting elements that emit light of a first color, for example, red, the second color light emitting elements LDg may be green light emitting elements that emit light of green, and the third color light emitting elements LDb may be blue light emitting elements that emit light of blue. However, the color of the light emitted from each light emitting element LD may vary according to an embodiment.

According to an embodiment, an upper substrate UPL may be disposed on the pixels PXL. For example, the upper substrate UPL (also referred to as an "encapsulation substrate" or a "color filter substrate") encapsulating the display area DA may be disposed on one surface of the base layer BSL on which the pixels PXL may be disposed.

The upper substrate UPL may selectively include a light control layer LCP overlapping the pixels PXL. For example, the light control layer LCP including a color filter layer CFL may be disposed on one surface of the upper substrate UPL facing the pixels PXL.

The color filter layer CFL may include a color filter CF matching a color of each pixel PXL. For example, the color filter layer CFL may include a first color filter CF1 disposed on the first color pixel CPX1 to selectively transmit light generated in the first color pixel CPX1, a second color filter CF2 disposed on the second color pixel CPX2 to selectively transmit light generated in the second color pixel CPX2, and a third color filter CF3 disposed on the third color pixel CPX3 to selectively transmit light generated in the third color pixel CPX3. In an embodiment, the first color filter CF1, the second color filter CF2, and the third color filter CF3 may be a red color filter, a green color filter, a and blue color filter, respectively, but are not limited thereto.

The first color filter CF1 may include a color filter material disposed between the first color pixel CPX1 and the upper substrate UPL and selectively transmitting light of a first color generated in the first color pixel CPX1. For example, in a case that the first color pixel CPX1 may be a red pixel, the first color filter CF1 may include a red color filter material.

The second color filter CF2 may include a color filter material disposed between the second color pixel CPX2 and the upper substrate UPL and selectively transmitting light of a second color generated in the second color pixel CPX2. For example, in a case that the second color pixel CPX2 may be a green pixel, the second color filter CF2 may include a green color filter material.

The third color filter CF3 may include a color filter material disposed between the third color pixel CPX3 and the upper substrate UPL and selectively transmitting light of a third color generated in the third color pixel CPX3. For example, in a case that the third color pixel CPX3 may be a blue pixel, the third color filter CF3 may include a blue color filter material.

The light blocking pattern LBP may be disposed among the first to third color filters CF1, CF2, and CF3. For example, the light blocking pattern LBP may be disposed on one surface of the upper substrate UPL to face the second bank BNK2, and may overlap an edge of each of the first to third color filters CF1, CF2, and CF3. The light blocking pattern LBP may be opened in a region corresponding to each light emitting area EMA.

The light blocking pattern LBP may include at least one black matrix material (for example, at least one light blocking material currently known) of various types of black matrix materials, a color filter material of a specific or predetermined color, and/or the like within the spirit and the scope of the disclosure. For example, the light blocking pattern LBP may be formed of the same or similar material as the second bank BNK2, but is not limited thereto. For example, the light blocking pattern LBP and the second bank BNK2 may include the same or different materials.

In an embodiment, the light blocking pattern LBP may including opening OPN of a uniform size (for example, a uniform area) on the pixels PXL forming each pixel unit PXU, regardless of the color of each pixel PXL. In an embodiment, the light blocking pattern LBP may have openings OPN of different sizes (for example, different areas) on the pixels PXL according to the color of the pixels PXL forming each pixel unit PXU.

In an embodiment, a predetermined filler having a relatively low refractive index may be filled in a space between a lower panel of the display panel PNL including the base layer BSL and the display layer DPL and an upper panel of the display panel PNL including the upper substrate UPL and the light control layer LCP so that the light emitted from the light emitting elements LD may be smoothly emitted to the upward direction of the pixels PXL. In an embodiment, the space between the lower panel and the upper panel of the display panel PNL may be filled with an air layer.

Meanwhile, FIG. 11A discloses an embodiment in which the upper substrate UPL may be disposed on the base layer BSL on which the pixels PXL may be disposed, but the disclosure is not limited thereto. For example, the color filter layer CFL and the light blocking pattern LBP may be formed or disposed on one or a surface of the base layer BSL on which the pixels PXL may be disposed, and one surface of the base layer BSL may be encapsulated using a thin film encapsulation layer, or the like within the spirit and the scope of the disclosure.

Referring to FIG. 11B, the first, second, and third color pixels CPX1, CPX2, and CPX3 may include the light emitting elements LD that emit light of the same color. For example, all of the first color, the second color, and the third color pixels CPX1, CPX2, and CPX3 include the third color light emitting elements LDb (for example, blue light emitting elements) that emit light of blue. For example, the third color light emitting elements LDb may emit blue light belonging to a wavelength band in a range of about 400 nm to about 500 nm.

In this case, a color conversion pattern layer CCL including at least one type of color conversion particles may be disposed on the first color and the second color pixels CPX1 and CPX2. Accordingly, the display device according to an embodiment may display a full-color image.

For example, the light control layer LCP may include the color conversion pattern layer CCL (and/or a light scattering layer LSL) and the color filter layer CFL disposed on one surface of the upper substrate UPL to face the pixels PXL. The color conversion pattern layer CCL may be disposed between the color filter layer CFL and the pixels PXL, and may include color conversion particles.

By way of example, the light control layer LCP may include a first light control layer LCP1 disposed on the first color pixel CPX1, a second light control layer LCP2 disposed on the second color pixel CPX2, and a third light control layer LCP3 disposed on the third color pixel CPX3. For example, the first, second, and third light control layers LCP1, LCP2, and LCP3 may include color conversion pattern layers CCL (or light scattering layers LSL) and/or color filters CF corresponding to a predetermined color, respectively.

For example, the first light control layer LCP1 may include a first color conversion pattern layer CCL1 including first color conversion particles corresponding to the first color, and a first color filter CF1 that selectively transmits the light of the first color. Similarly, the second light control layer LCP2 may include a second color conversion pattern layer CCL2 including second color conversion particles corresponding to the second color, and a second color filter CF2 that selectively transmits the light of the second color. The third light control layer LCP3 may include at least one of the light scattering layer LSL including light scattering particles SCT, and a third color filter CF3 that selectively transmits the light of the third color.

In an embodiment, the first color conversion pattern layer CCL1, the second color conversion pattern layer CCL2, and the light scattering layer LSL may be formed or disposed on one or a surface of the upper substrate UPL on which the first, second, and third color filters CF1, CF2, and CF3 and the light blocking pattern LBP may be disposed. For example, a protective layer PRL may be disposed on a surface of the first color conversion pattern layer CCL1, the second color conversion pattern layer CCL2, and the light scattering layer LSL.

According to an embodiment, a pattern capable of blocking light may be additionally disposed between the first color conversion pattern layer CCL1, the second color conversion pattern layer CCL2, and the light scattering layer LSL. For example, the light blocking pattern LBP may have a multi-layer structure including a first light blocking pattern LBP1 interposed between the first, second, and third color filters CF1, CF2, and CF3, and a second light blocking pattern LBP2 interposed between the first color conversion pattern layer CCL1, the second color conversion pattern layer CCL2, and the light scattering layer LSL.

Meanwhile, an embodiment of FIG. 11B shows the display panel PNL of a structure in which the second light blocking pattern LBP2 may be first formed or disposed on one or a surface of the upper substrate UPL and then the first color conversion pattern layer CCL1, the second color conversion pattern layer CCL2, and the light scattering layer LSL may be formed or disposed, but an order of forming the second light blocking pattern LBP2 may be changed. For example, in an embodiment, the first color conversion pattern layer CCL1, the second color conversion pattern layer CCL2, and the light scattering layer LSL may be first formed or disposed on one or a surface of the upper substrate UPL on which the color filter CF or the like may be disposed, and then the second light blocking pattern LBP2 may be formed or disposed. For example, the order forming the first color conversion pattern layer CCL1, the second color conversion pattern layer CCL2, the light scattering layer LSL, and the second light blocking pattern LBP2 may vary according to performance, a manufacturing method, or the like of equipment used to form the first color conversion pattern layer CCL1, the second color conversion pattern layer CCL2, and the light scattering layer LSL.

In an embodiment, the first light blocking pattern LBP1 and the second light blocking pattern LBP2 may be integrated. For example, the first light blocking pattern LBP1 may be formed or disposed in a thickness (or a height) sufficient to be positioned between the first color conversion pattern layer CCL1, the second color conversion pattern layer CCL2, and the light scattering layer LSL. For example, the light blocking pattern LBP may be formed as a single layer or multiple layers, and a structure, a position and/or a height thereof may be variously changed.

The first color conversion pattern layer CCL1 may be disposed on the first color pixel CPX1 and may convert the light of the third color emitted from the third color light emitting elements LDb into the light of the first color. To this end, the first color conversion pattern layer CCL1 may be disposed between the third color light emitting elements LDb and the first color filter CF1, and may include first color conversion particles. For example, in a case that the third color light emitting elements LDb disposed on the first color pixel CPX1 may be blue light emitting elements emitting the light of blue and the first color pixel CPX1 may be a red pixel, the first color conversion pattern layer CCL1 may include a red quantum dot QDr that converts the light of blue emitted from the third color light emitting elements LDb into light of red. In this case, the first color filter CF1 may be a red color filter.

The red quantum dot QDr may absorb blue light, shift a wavelength according to an energy transition, and emit red light of a wavelength range of about 620 nm to about 780 nm. Meanwhile, in a case that the first color pixel CPX1 may be a pixel of a different color, the first color conversion pattern layer CCL1 may include a first quantum dot corresponding to the color of the first color pixel CPX1.

The second color conversion pattern layer CCL2 may be disposed on the second color pixel CPX2 and may convert the light of the third color emitted from the third color light emitting elements LDb into the light of the second color. To this end, the second color conversion pattern layer CCL2 may be disposed between the third color light emitting elements LDb and the second color filter CF2, and may include second color conversion particles. For example, in a case that the third color light emitting elements LDb disposed on the second color pixel CPX2 may be blue light emitting elements emitting the light of blue and the second color pixel CPX2 may be a green pixel, the second color conversion pattern layer CCL2 may include a green quantum dot QDg that converts the light of blue emitted from the third color light emitting elements LDb into the light of green. In this case, the second color filter CF2 may be a green color filter.

The green quantum dot QDg may absorb blue light, shift a wavelength according to an energy transition, and emit green light of a wavelength range of about 500 nm to about 570 nm. Meanwhile, in a case that the second color pixel CPX2 may be a pixel of a different color, the second color conversion pattern layer CCL2 may include a second quantum dot corresponding to the color of the second color pixel CPX2.

The light scattering layer LSL may be disposed on the third color pixel CPX3. For example, the light scattering layer LSL may be disposed between the third color light emitting elements LDb and the third color filter CF3 of the third color pixel CPX3. Meanwhile, the light scattering layer LSL may be omitted according to an embodiment.

According to an embodiment, in a case that the third color light emitting elements LDb disposed in the third color pixel CPX3 may be blue light emitting elements emitting the light of blue and the third color pixel CPX3 may be a blue pixel, the light scattering layer LSL may be selectively provided to efficiently utilize the light emitted from the blue light emitting elements. The light scattering layer LSL may include at least one type of light scattering particles SCT. At this time, the third color filter CF3 may be a blue color filter.

The light scattering layer LSL may include a plurality of light scattering particles SCT dispersed in a predetermined matrix material. For example, the light scattering layer LSL may include the light scattering particles SCT such as titanium dioxide $TiO_2$ or silica, but is not limited thereto. Meanwhile, the light scattering particles SCT may not be disposed on the third color pixel CPX3. For example, the first and/or second color conversion pattern layers CCL1 and/or CCL2 may also selectively include the light scattering particles SCT.

In an embodiment, the light of blue having a relatively short wavelength in a visible region may be incident on each of the red quantum dot QDr and the green quantum dot QDg to increase an absorption coefficient of the red quantum dot QDr and the green quantum dot QDg. Accordingly, finally, efficiency of the light emitted from the first color pixel PXL1 and the second color pixel PXL2 may be increased, and excellent color reproducibility may be secured. For example, manufacturing efficiency of the display device may be increased by forming the light emitting unit EMU of the first color, second color, and third color pixels CPX1, CPX2, and CPX3 using the of light emitting elements LD (for example, the blue light emitting elements) of the same color.

According to an embodiment of FIG. 11B, the pixels PXL and the display device having the same may be easily manufactured using the light emitting elements LD (for example, the blue light emitting elements) of a single color. For example, the color conversion layer CCL may be disposed on at least some or a predetermined number of the pixels PXL to manufacture the pixel unit PXU of a full-color and the display device having the same.

Figure 12A:
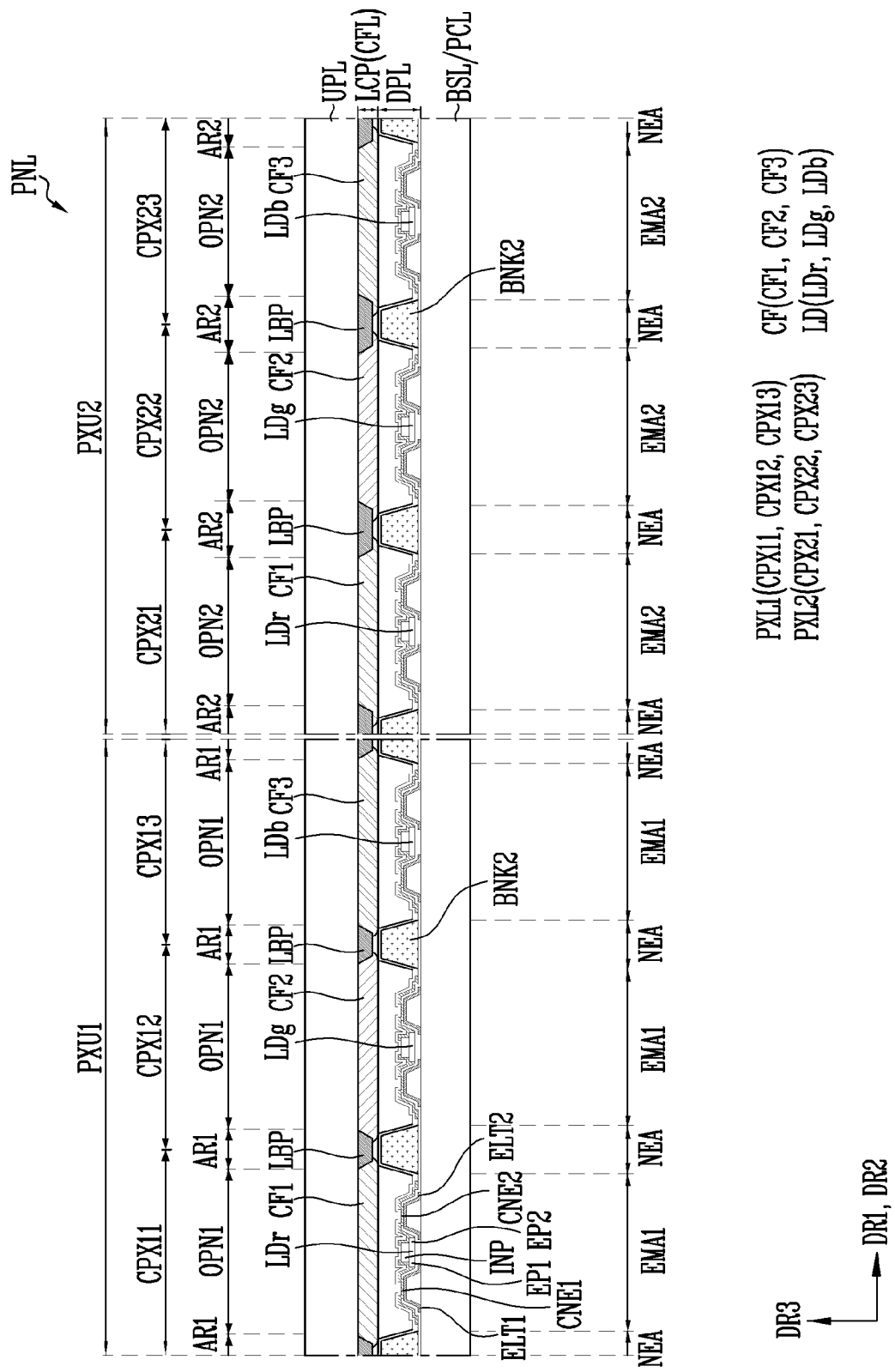
FIGS. 12A and 12B are schematic cross-sectional views illustrating the display device according to an embodiment, respectively.
Figure 12B:
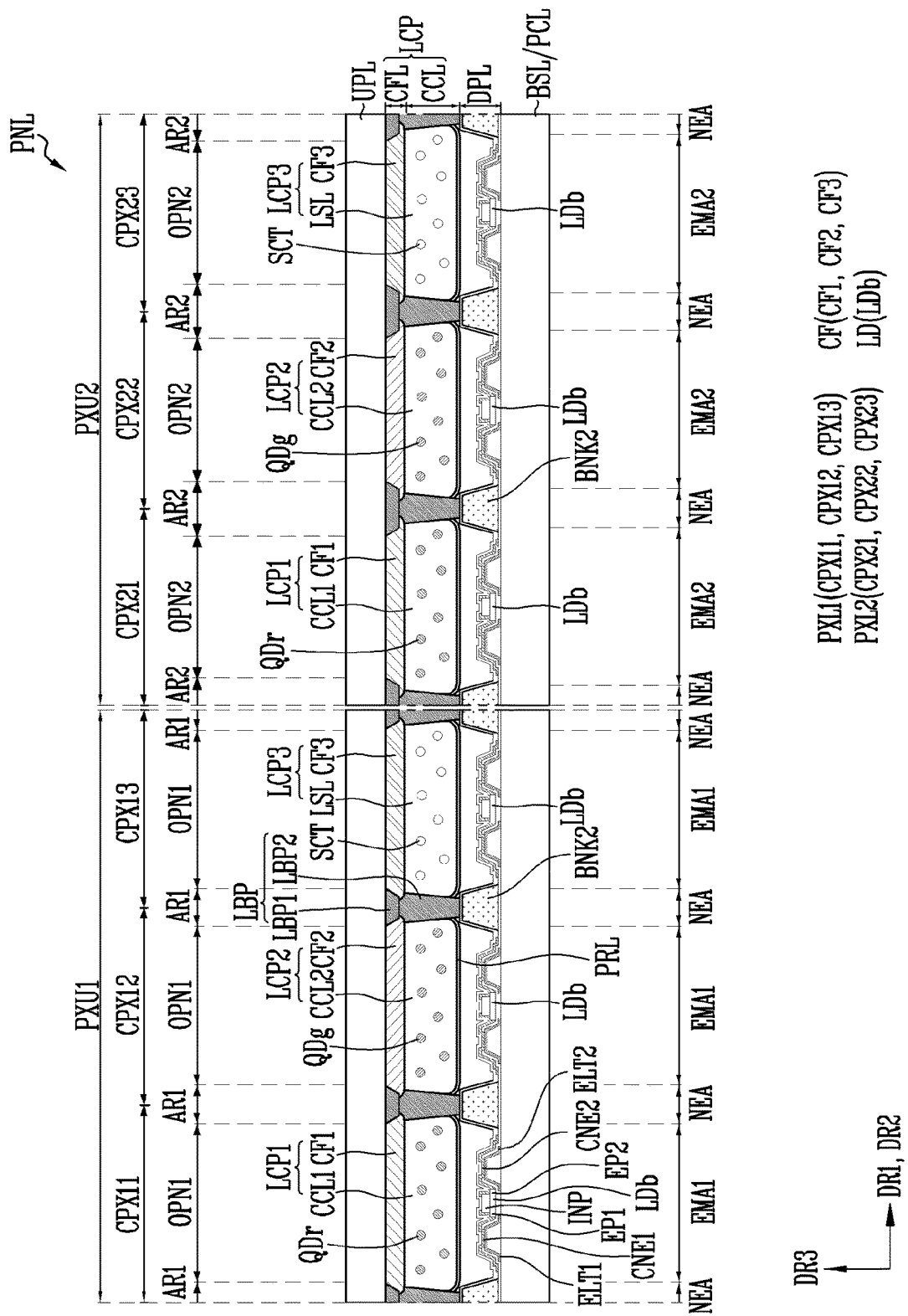

FIGS. 12A and 12B are schematic cross-sectional views illustrating the display device according to an embodiment, respectively. For example, FIGS. 12A and 12B show schematic cross-sectional views of the display panel PNL based on a region in which one first pixel unit PXU1 and a second pixel unit PXU2 may be disposed, respectively. For example, FIGS. 12A and 12B respectively show schematic cross-sectional views corresponding to a line III~III' and a line IV~IV' of FIGS. 9A and 9B with respect to the first pixel PXL1 and the second pixel PXL2 to show that the light blocking pattern LBP is opened by different areas (for example, different lengths and/or widths) on the first pixels PXL1 and the second pixels PXL2.

Referring to FIGS. 2 to 12B, the light blocking pattern LBP may be opened to have a first opening OPN1 on each first pixel PXL1, and may be opened to have a second opening OPN2 having the area less than that of the first opening OPN1 on each second pixel PXL2. Accordingly, the light blocking pattern LBP may have a relatively narrow width in an outer region (and/or a peripheral region thereof) AR1 of the first pixels PXL1, and may have a relatively wider width in an outer region (and/or a peripheral region thereof) AR2 of the second pixels PXL2.

For example, the first color first pixel CPX11 may include the first color light emitting elements LDr of a first number, and the first color second pixel CPX21 may include the first color light emitting elements LDr of a second number greater than the first number. In this case, the light blocking pattern LBP may be opened on the first color second pixel CPX21 by the area less than that on the first color first pixel CPX11. Accordingly, the first color second pixel CPX21 may have an aperture ratio less than that of the first color first pixel CPX11, a luminance deviation of the first color first pixel CPX11 and the first color second pixel CPX21 according to the number deviation of the first color light emitting elements LDr may be reduced or canceled.

In an embodiment, as shown in FIG. 12B, in a case that the light blocking pattern LBP has the multi-layer structure including the first light blocking pattern LBP1 and the second light blocking pattern LBP2, the aperture ratio of the first and/or second pixels PXL1 and/or PXL2 may be adjusted by adjusting an aperture ratio of at least one of the first and second light blocking patterns LBP1 and LBP2. For example, the area of the second openings OPN2 may be reduced by reducing the opening area of the first light blocking pattern LBP1 on each second pixel PXL2. Accordingly, the aperture ratio of the second pixels PXL2 may be reduced. Meanwhile, in an embodiment, the area of the second openings OPN2 may be reduced by reducing the opening area of the second light blocking pattern LBP2 or reducing the opening areas of both of the first and second light blocking patterns LBP1 and LBP2, on the second pixels PXL2. In this case, in each second opening OPN2, the formation areas of the first and second color conversion pattern layers CCL1 and CCL2 and the light scattering layer LSL may be reduced.

Meanwhile, in the above-described embodiment, in order to reduce or prevent the luminance deviation of the first and second pixels PXL1 and PXL2, the aperture ratio of the second pixels PXL2 is reduced, but the disclosure is not limited thereto. For example, the luminance deviation of the first and second pixels PXL1 and PXL2 may be reduced or prevented by maintaining the aperture ratio of the second pixels PXL2 and increasing an aperture ratio of the first pixels PXL1. Alternatively, the luminance deviation of the first and second pixels PXL1 and PXL2 may be reduced or prevented by adjusting the aperture ratio of both of the first and second pixels PXL1 and PXL2.

Although the disclosure has been described in detail in accordance with the above-described embodiments, it should be noted that the above-described embodiments are for the purpose of description and not of limitation. In addition, those skilled in the art may understand that various modifications are possible within the spirit and scope of the disclosure.

The scope of the disclosure is not limited to the details described in the detailed description of the specification, but should be defined by the claims. In addition, it is to be construed that all changes or modifications derived from the meaning and scope of the claims and equivalents thereof are included in the scope of the disclosure.

What is claimed is:

1. A display device comprising:
    at least one first pixel each including a first light emitting area in which first light emitting elements are arranged;
    at least one second pixel each including a second light emitting area in which second light emitting elements are arranged;
    a light blocking pattern disposed on the at least one first pixel and the at least one second pixel to overlap a peripheral area of the first light emitting area and the second light emitting area, the light blocking pattern including:
        a first opening corresponding to the first light emitting area of the at least one first pixel; and
        a second opening corresponding to the second light emitting area of the at least one second pixel; and
    a color filter including:
        a first color filter pattern disposed in the first opening of the light blocking pattern; and
        a second color filter pattern disposed in the second opening of the light blocking pattern, wherein
    the at least one second pixel includes a greater number of the second light emitting elements than a number of the first light emitting elements of the at least one first pixel, and
    the second opening of the light blocking pattern has an area smaller than an area of the first opening of the light blocking pattern.

2. The display device according to claim 1, wherein
    each of the first opening and the second opening of the light blocking pattern has a shape extending along a first direction, and
    the second opening of the light blocking pattern has a length shorter than a length of the first opening of the light blocking pattern in the first direction.

3. The display device according to claim 2, wherein
    the first color filter pattern and the second color filter pattern have a same color and have a shape extending along the first direction, and
    the second color filter pattern has a length shorter than a length of the first color filter pattern in the first direction.

4. The display device according to claim 1, wherein the second color filter pattern has an area smaller than an area of the first color filter pattern.

5. The display device according to claim 1, wherein the first light emitting elements and the second light emitting elements emit light of a same color.

6. The display device according to claim 5, further comprising:
a first color conversion pattern layer disposed on the at least one first pixel and the at least one second pixel and including first color conversion particles that convert light emitted from the first light emitting elements and the second light emitting elements into light of a first color.

7. The display device according to claim 1, wherein
the at least one first pixel includes a plurality of first pixels including first light emitting elements arranged in each first light emitting area of the plurality of first pixels; and
the at least one second pixel includes a plurality of second pixels including second light emitting elements arranged in each second light emitting area of the plurality of second pixels.

8. The display device according to claim 7, wherein
the plurality of first pixels include at least one first color first pixel, at least one second color first pixel, and at least one third color first pixel, and
the plurality of second pixels include at least one first color second pixel, at least one second color second pixel, and at least one third color second pixel.

9. The display device according to claim 8, wherein
the first color second pixel includes second light emitting elements of a greater number than a number of first light emitting elements arranged in the first color first pixel, and
the light blocking pattern includes an opening of a smaller area on the first color second pixel than an opening of an area on the first color first pixel.

10. The display device according to claim 1, further comprising:
at least one pixel block including a plurality of pixels arranged along a second direction,
wherein the at least one pixel block includes:
first pixels disposed at ends of the at least one pixel block; and
second pixels disposed between the first pixels disposed at the ends of the at least one pixel block in the second direction.

11. The display device according to claim 10, wherein
the at least one pixel block includes a plurality of pixel blocks, and
the display device comprises a display area in which the plurality of pixel blocks are arranged.

12. The display device according to claim 10, wherein the light blocking pattern comprises:
first openings disposed on each of the first pixels; and
second openings disposed on each of the second pixels and having an area smaller than an area of each of the first openings of the light blocking pattern.

13. The display device according to claim 10, wherein the color filter comprises:
a first color first color filter pattern disposed on a first color first pixel among the first pixels; and
a first color second color filter pattern disposed on a first color second pixel among the second pixels.

14. The display device according to claim 13, wherein the first color second color filter pattern has an area smaller than an area of the first color first color filter pattern.

* * * * *